(12) United States Patent
Harada et al.

(10) Patent No.: US 7,982,524 B2
(45) Date of Patent: Jul. 19, 2011

(54) LEVEL SHIFT CIRCUIT AND SEMICONDUCTOR DEVICE THEREOF

(75) Inventors: Yuichi Harada, Matsumoto (JP); Yoshihiro Ikura, Matsumoto (JP); Yasumasa Watanabe, Matsumoto (JP); Katsunori Ueno, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 481 days.

(21) Appl. No.: 12/131,026

(22) Filed: May 30, 2008

(65) Prior Publication Data
US 2009/0085117 A1    Apr. 2, 2009

(30) Foreign Application Priority Data
May 31, 2007   (JP) .................................. 2007-144521

(51) Int. Cl.
*H03L 5/00*   (2006.01)
(52) U.S. Cl. ............. 327/333; 327/538; 326/62; 326/81
(58) Field of Classification Search .............. 326/62–63, 326/80–81; 327/306, 333, 538–541
See application file for complete search history.

(56) References Cited

U.S. PATENT DOCUMENTS

| | | | | |
|---|---|---|---|---|
| 5,450,304 A | * | 9/1995 | Cox | ............................ 363/21.05 |
| 5,488,288 A | * | 1/1996 | Elmer | ............................ 323/284 |
| 6,597,550 B1 | | 7/2003 | Chey et al. | |
| 6,937,180 B1 | * | 8/2005 | Muratov et al. | ................ 341/154 |
| 7,154,789 B2 | * | 12/2006 | Kim et al. | ................ 365/189.09 |
| 7,750,439 B2 | * | 7/2010 | Inoue | ............................ 257/603 |
| 2007/0164811 A1 | * | 7/2007 | Crippa et al. | ................ 327/541 |

FOREIGN PATENT DOCUMENTS

| | | |
|---|---|---|
| JP | 7-95680 B2 | 10/1995 |
| JP | 2001-25235 A | 1/2001 |
| JP | 2001-210792 A | 8/2001 |
| JP | 3346763 B2 | 8/2001 |

* cited by examiner

*Primary Examiner* — Dinh T. Le
(74) *Attorney, Agent, or Firm* — Rossi, Kimms & McDowell LLP

(57) ABSTRACT

A level shift circuit and a semiconductor device are configured to prevent failure and malfunction even when an excessive negative voltage or ESD surge are applied to a high-voltage power supply terminal. The level shift circuit includes a level shift resistor, a current-limiting resistor connected in series to the level shift resistor, and an n-channel MOSFET, with its drain connected to the current-limiting resistor. An output of the level-up circuit is obtained from the positioned between the level shift resistor and the current-limiting resistor. By providing the current-limiting resistor, the current that flows due to an excessive negative voltage or ESD surge is suppressed to prevent the level shift circuit from failing or malfunctioning.

15 Claims, 22 Drawing Sheets

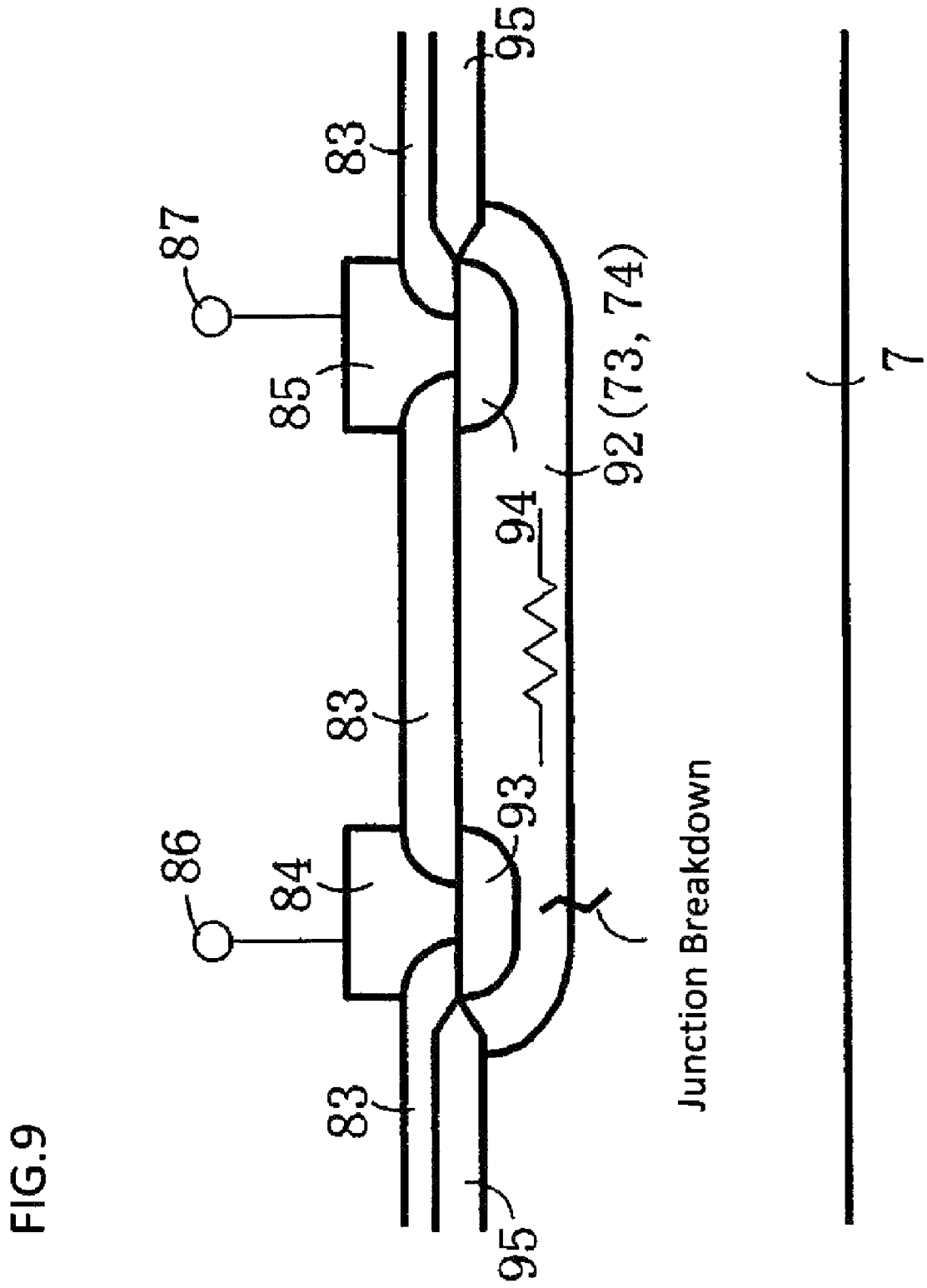

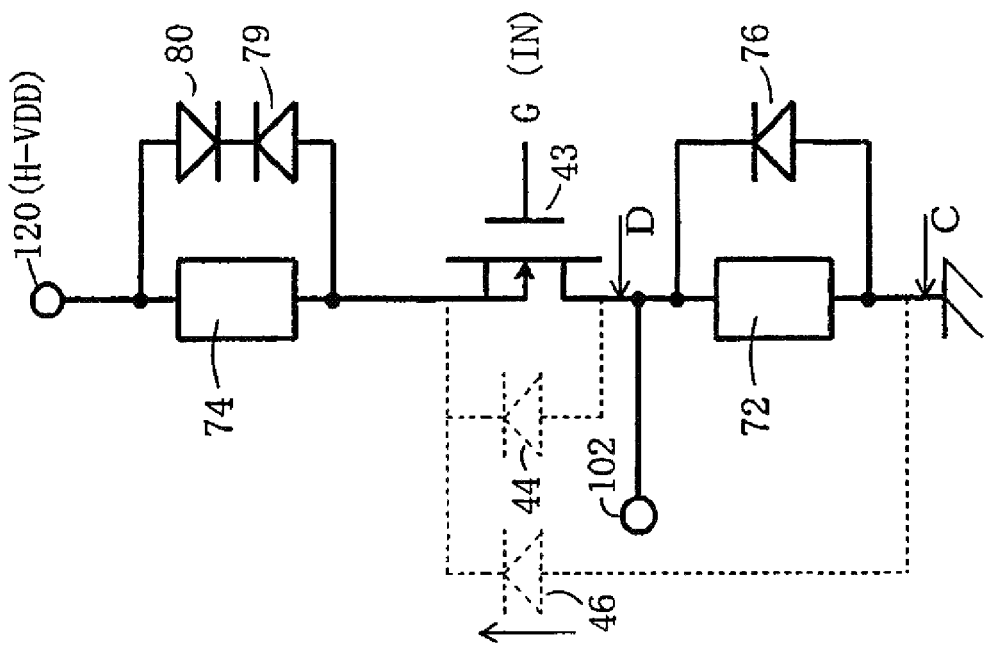
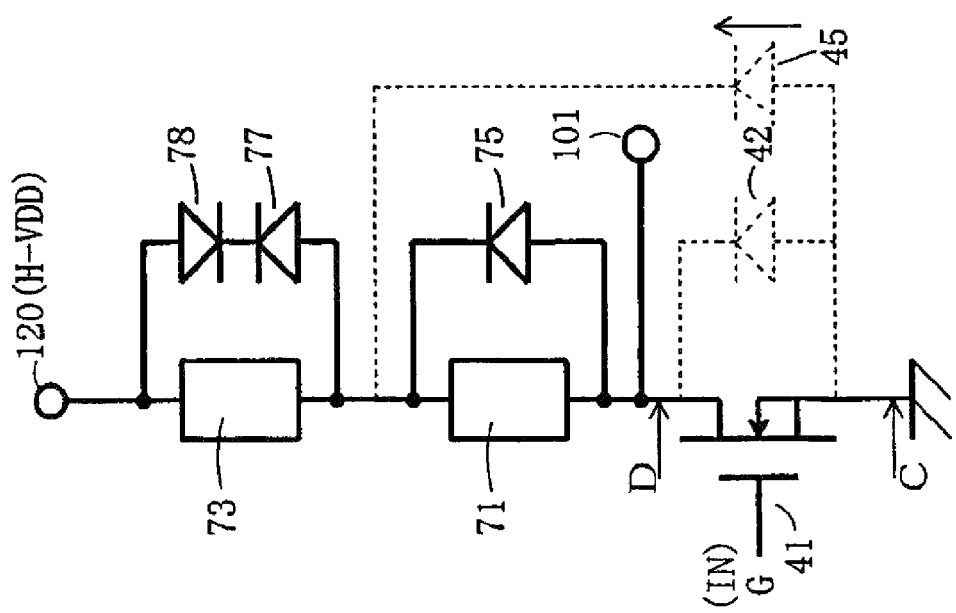

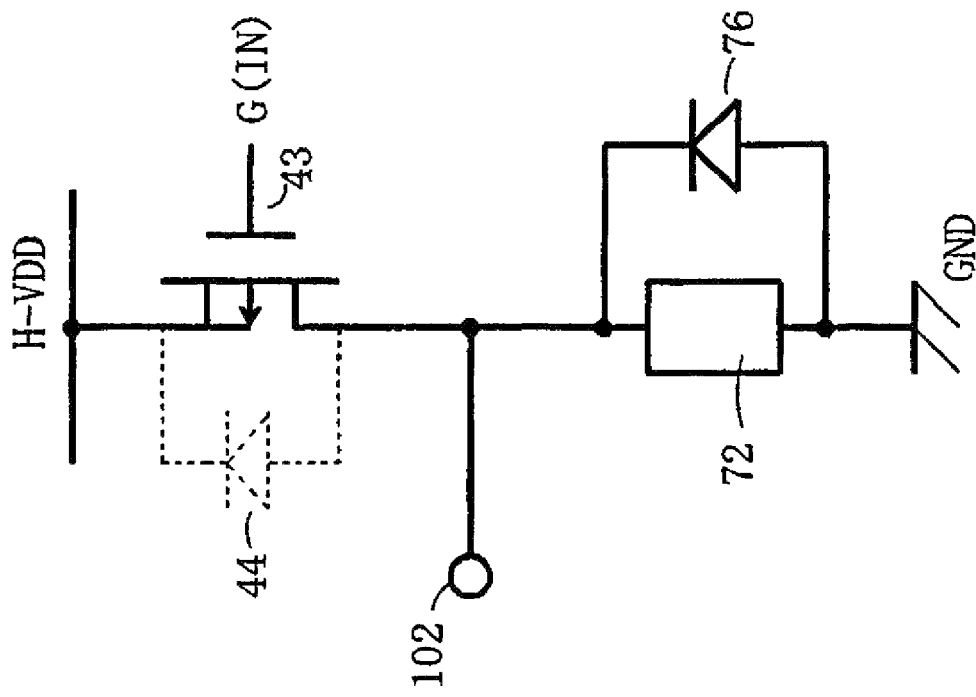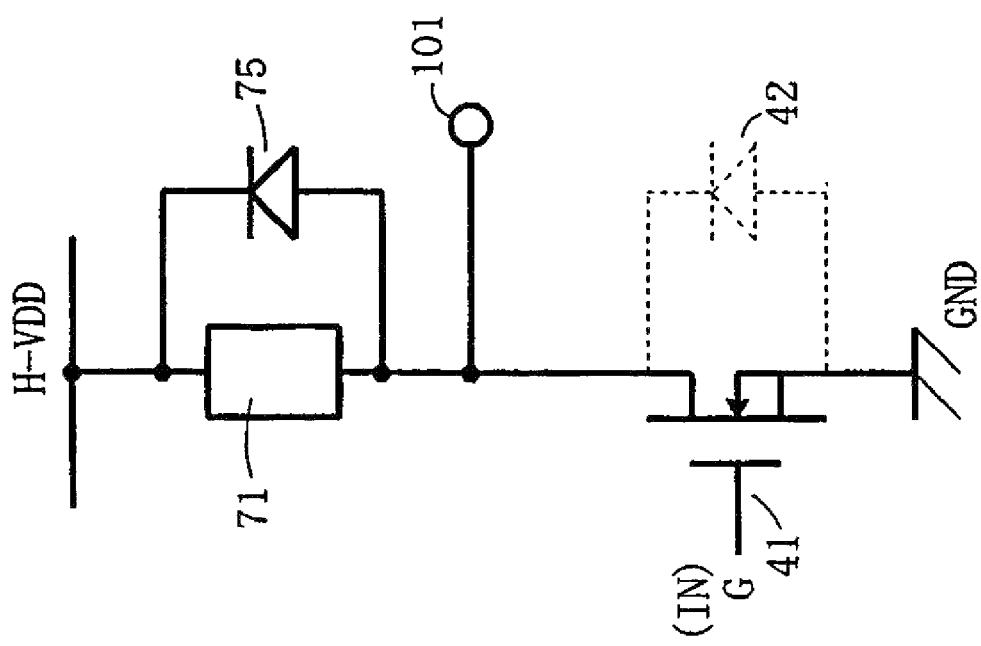

LEVEL SHIFT CIRCUIT AND SEMICONDUCTOR DEVICE THEREOF

BACKGROUND

FIG. 17 shows an example of connections between power semiconductor switching elements and a conventional semiconductor device (HVIC, High-Voltage Integrated Circuit) in an inverter or other power conversion device. Specifically, FIG. 17 shows an example of a half bridge, in which two power semiconductor switching elements (e.g., IGBTs) 114, 115 are connected in series. By alternately turning ON the upper-arm IGBT 115 and the lower-arm IGBT 114, the high potential or low potential are output alternately from the Vs terminal, which serves as the output terminal to supply an AC power to the L load 118. That is, the IGBT 114 and IGBT 115 are configured to operate so that when the high potential is output, the upper-arm IGBT 115 is turned ON while the lower-arm IGBT 114 is turned OFF, and when the low potential is output, the upper-arm IGBT 115 is turned OFF while the lower-arm IGBT 114 is turned ON. The diodes 116 and 117, which are reversely connected in parallel with the IGBTs 114, 115, are FWDs (Free Wheel Diodes). The driving semiconductor device 111 (HVIC) outputs a signal with GND as a reference as the gate signal for the lower-arm IGBT 114, and outputs a signal with the Vs terminal as a reference as the gate signal for the upper-arm IGBT 115. Hence, the driving semiconductor device 111 (HVIC) must be provided with a level shift function.

Among the symbols/references in the figures, Vss indicates a high-potential side of a high-voltage power supply, GND is the ground, Vs is an intermediate potential, H-VDD is a high-potential side of a low-voltage power supply with a Vs terminal as a reference, L-VDD is a low-potential side of the low-voltage power supply with the GND as a reference, H-IN is an input terminal from which an input signal is input to the gate of a low-side C-MOS circuit (low-potential side low-voltage circuit region) connected to the level-up circuit, L-IN is an input terminal from which an input signal is input to the gate of the low-side C-MOS circuit (low-potential side low voltage circuit region) connected to the gate of the lower-arm IGBT 114, H-OUT is an output terminal from which an output signal of the high-side C-MOS circuit (high-potential side low-voltage region) is output to the gate of the upper-arm IGBT 115, L-OUT is an output terminal from which an output signal is output to the gate of the lower-arm IGBT 114, ALM-IN is an input terminal to which an input signal of a detection signal is input when detecting temperature and overcurrent of the upper-arm IGBT 115, and ALM-OUT is an output terminal from which an output signal of the detection signal is output with a lowered level (level-down-converted detection signal). Moreover, n and p indicate conduction types, where n is an n-type and p is a p-type.

Referring to FIGS. 18 and 19, which are circuit diagrams showing the level shift circuits and the peripheral circuits, the driving semiconductor device 111 includes a level-up circuit (a circuit diagram illustrated in FIG. 18) and a level-down circuit (a circuit diagram illustrated in FIG. 19). As peripheral circuits, a low-side C-MOS circuit transmits the input signal from the level shift circuit, and a high-side C-MOS circuit transmits the output signal from the level shift circuit to the upper-arm IGBT 115.

In FIG. 18, when the input signal (H-IN) is input to the low-side circuit, the signal passes through its C-MOS circuit and is input to the gate of the n-channel MOSFET 41 of the level-up circuit. This signal turns the n-channel MOSFET 41 ON and OFF. The output signal from the level-up circuit is output from its output portion 101, to the C-MOS circuit of the high-side circuit, which outputs an ON/OFF output signal (H-OUT). This output signal is converted into a signal with Vs as a reference. This output signal is input to the gate of the upper-arm IGBT 115, to turn the upper-arm IGBT 115 ON and OFF. The level-up circuit of FIG. 18 is necessary when the upper-arm IGBT 115 is an n-channel device.

In FIG. 19, the level-down circuit employs a p-channel MOSFET 43, a level shift resistor 72, and a diode 76 connected in parallel with the level shift resistor 72. The ALM-IN signal is input to the gate of the C-MOS circuit of the high-side circuit, and the C-MOS circuit output signal is input to the gate of the p-channel MOSFET 43 of the level-down circuit. By turning ON and OFF the p-channel MOSFET 43, a low-side signal is output from the output portion 102 of the level-down circuit, and the signal with level lowered, which is output from the C-MOS circuit of the low-side circuit, is output from ALM-OUT to the low side as the detection signal.

FIGS. 20A and 20B show in detail the level shift circuit of a conventional semiconductor device (HVIC). FIG. 20A illustrates the level-up circuit diagram, and FIG. 20B illustrates the level-down circuit diagram. The level-up circuit shown in FIG. 20A comprises a level shift resistor 71, and an n-channel MOSFET 41, with its drain connected to the level shift resistor 71. The connection of the level shift resistor 71 and the n-channel MOSFET 41 serves as the output portion 101 of the level-up circuit. To prevent failure of the level shift resistor 71 when H-VDD is at a greatly lower potential than the GND potential (when an excessive negative voltage is applied), a diode 75 is connected in parallel with the level shift resistor 71. When an overvoltage is applied to H-VDD, the diode 75 advantageously prevents an excessive voltage from being applied to the gate of the MOSFET of the C-MOS circuit of the high-side circuit. Normally, a Zener diode is used as this diode. Also, the n-channel MOSFET 41 incorporates a body diode 42 (shown in phantom) reversely connected in parallel.

The level-down circuit shown in FIG. 20B comprises a p-channel MOSFET 43, with its drain connected to the level shift resistor 72. The connection portion between the level shift resistor 72 and p-channel MOSFET 43 serves as the output portion 102 of the level-down circuit. To prevent failure of the level shift resistor 72 when H-VDD is at a greatly lower potential than the GND potential (when an excessive negative voltage is applied), a diode 76 is connected in parallel with the level shift resistor 72. When an overvoltage is applied to H-VDD during the turn-ON operation of the MOSFET 43, the diode 76 advantageously prevents an overvoltage from being applied to the gate of the MOSFET of the C-MOS circuit of the low-side circuit. Also, the n-channel MOSFET 43 incorporates a body diode 44 (shown in phantom) reversely connected in parallel.

FIGS. 21 and 22 show the configuration of semiconductor devices employing a level-up circuit. FIG. 21 is a cross-sectional view of principal portions of a junction isolation-type semiconductor device, and FIG. 22 is a cross-sectional view of principal portions of an insulation-isolated type semiconductor device. In FIG. 21, an n-well region 2 and an n-well region 3 are formed at the surface of the p-type semiconductor substrate 1, which is connected to the GND potential. A C-MOS circuit of the low-side circuit is formed within the n-well region 2, while the level shift circuit and the C-MOS circuit of the high-side circuit are formed within the n-well region 3. The level shift n-channel MOSFET 41 is formed by forming a p-type region 51 within the n-well region 3, forming an n source region 53 and a p contact region 54 in the surface layer, forming an n drain region 52 in the surface layer of the n-well region 3, and forming a gate electrode 55, within a gate oxidation film intervening, on the p region 51 extending between the n source region 53 and the n drain region 52.

The drain region 52 of this n-channel MOSFET 41 is connected to the H-VDD via the level shift resistor 71 using surface metal wiring, and the connection portion between the drain region 52 and the level shift resistor 71 becomes the level-up circuit output portion 102. The output portion 102 outputs a low potential when this level-up n-channel MOSFET 41 is turned ON, and outputs a high potential when turned OFF, so that level shift operation, which is the signal transmission between different reference potentials, can be performed.

FIG. 22 shows a cross-sectional view of principal portions of a semiconductor device (HVIC) when an SOI substrate is used. The construction in FIG. 22 is different from that of FIG. 21 in that the GND reference n-well region 2 and Vs reference n-well region 3 correspond to an n-well region 6 and an n-well region 7, surrounded by insulating films 8, 9 on the surface of an n substrate 5. By this means, parasitic operation can be suppressed, and safer operation becomes possible.

Japanese Patent No. 3346763, corresponding to U.S. Pat. No. 6,597,550, discloses a high-voltage integrated circuit chip, and more specifically a circuit used to protect a high-voltage integrated circuit that drives power transistors in a half-bridge configuration, and which is a high-voltage integrated circuit chip having a resistor, between the substrate and the ground, to limit the current during negative-voltage spikes, for use with circuits whose excessive negative spikes at the output node are anticipated.

Further, Japanese Patent Laid-open No. 2001-25235 discloses a driving device in which, by inserting a diode between the drain electrode of a switching element belonging to a level shifter and the gate electrode of a MOS transistor belonging to an amplifier (C-MOS circuit), the reverse-bias effect is diminished. Further, Japanese Patent Publication No. 7-95680 discloses a level-up circuit driving the upper-arm p-channel MOSFET of a main circuit, in which a resistor is connected between the level shift resistor and the drain of an n-channel MOSFET.

For the connections shown in FIG. 17, Vss is approximately 1200 V, and when H-VDD is at a potential approximately 20 V higher than Vs the upper-arm IGBT 115 operates and the lower-arm IGBT 114 is turned OFF, in which case current flows from the upper-arm IGBT 115 to the L load 118. When from this state the IGBT 115 is turned OFF and the L load 118 attempts to maintain current, current flows from GND via the lower-arm FWD 116 and the Vs terminal drops to approximately −100 V below GND. When the potential at the terminal Vs is approximately −100 V, the potential at terminal H-VDD is approximately −80 V.

In the construction of FIG. 21, the p substrate 1 is at the GND potential. When the potential at the terminal Vs falls until the n-well region 3 is lower than the GND potential, the parasitic diode 45 formed by the p region 1 and n-well region 3 is forward-biased, and a large current flows. This current flows between the gate and source of the IGBT 115, and there is no resistance component limiting the current flow in this path, so that an extremely large pulse current flows. As a result of this pulse current, the semiconductor device (HVIC) can fail or malfunction.

Further, when a dielectric isolation technique is applied as in FIG. 22, the parasitic diode 45 formed from the p substrate 1 and n-well region 3 in FIG. 21 does not exist, but a large current flows via the body diode 42 of the MOSFET formed from the p region 51 of the level shift MOSFET 41 and n-region 7, resulting in the semiconductor device (HVIC) failing or malfunctioning.

Further, while Japanese Patent No. 3346763 (corresponding U.S. Pat. No. 6,597,550) discloses connecting a current-limiting resistor to the ground, this reference fails to mention any alternate connection location other than this location. Further, in Japanese Patent Laid-open No. 2001-25235, a diode is connected to diminish the reverse-bias effect, but there is no mention of connecting any current-limiting resistance. Further, in Japanese Patent Publication No. 7-95680, the resistor connected between the level shift resistor and the drain of the n-channel MOSFET acts to adjust the gate voltage input to the gate of the p-channel MOSFET on the high side, through voltage division with the level shift resistor. For example, in a 1200 V-class HVIC, to reduce power consumption, a level shift resistor of several tens of kΩ is used, and in this case the voltage-division resistor is also several tens of kΩ. Hence, the rise time and fall time of the gate input signal are made longer. That is, the value of the voltage-division resistance is chosen not as a value to limit current so that the body diode of the n-channel MOSFET does not fail when an excessive negative voltage is input to the high-voltage power supply terminal, but rather to obtain the desired gate voltage.

Accordingly, there remains a need for a level shift circuit and a semiconductor device (HVIC) that do not fail or malfunction even when a negative voltage is applied to the H-VDD terminal or Vs terminal, or when an ESD (Electro Static Discharge) surge is applied. The present invention addresses this need.

SUMMARY OF THE INVENTION

The present invention relates to a level shift circuit and a semiconductor device that can prevent damage and malfunction due to the flow of overcurrents.

One aspect of the present invention is a level shift circuit of a driving circuit for driving a gate of a power device. The power device has one main terminal connected to a high-potential side of a high-voltage power supply and another main terminal connected to a load. A signal of a low-potential side low-voltage circuit region to which current is supplied from a low-voltage power supply, with a low-potential side of the high-voltage power supply as a reference, is converted into a signal of a high-potential side low-voltage circuit region to which current is supplied from the low-voltage power supply with the other main terminal of the power device as a reference.

The level shift circuit includes a first circuit provided between the high-potential side of the low-voltage power supply, with the another main terminal of the power device as a reference, and the low-potential side of the high-voltage power supply. The first circuit includes a current-limiting resistor, a MOSFET, with a source region and a channel region short-circuited, connected in series with the current-limiting resistor, a level shift resistor connected in series with the current-limiting resistor, and a protection diode connected in parallel with the level shift resistor, with the high-potential side of the low-voltage power supply as a cathode. The current-limiting resistor limits current flowing in a body diode of the MOSFET and is connected in series with a drain region of the MOSFET, with the current-limiting resistor between the MOSFET and the level shift resistor.

Another aspect of the present invention is a semiconductor device having the above-described level shift circuit, a low-potential side low-voltage circuit region, and a high-potential side low-voltage circuit region on a same substrate.

The high-potential side low-voltage circuit region can be in an n-type semiconductor insulation-isolated region in the substrate, which is a p-type semiconductor substrate, and connected to the high-potential side of the low voltage power supply with the another main terminal of the power device as a reference.

The MOSFET can include the substrate of a p-type semiconductor substrate, an n-type semiconductor region in the p-type semiconductor substrate and connected to one end of the current-limiting resistor, a p-type base region selectively placed in the n-type semiconductor region, the source region of an n-type source region selectively placed in the base region, a p-type contact region selectively placed adjacent to the source region in the base region, and the drain region of an n-type drain region selectively placed in the n-type semiconductor region, spaced from the base region. The source region and the contact region can be connected to the low-potential side of the high-voltage power supply, and the drain region can be connected to one end of the level shift resistor, the other end of the level shift resistor can be connected to one end of the current-limiting resistor, and the other end of the current-limiting resistor can be connected to the high-potential side of the low-voltage power supply.

In another embodiment, the MOSFET can include the substrate of a p-type semiconductor substrate, an n-type semiconductor region placed in the p-type semiconductor substrate and connected to one end of the current-limiting resistor, the source region of a p-type source region selectively placed in the n-type semiconductor region, an n-type contact region placed adjacent to the source region, and the drain region of a p-type drain region placed selectively in the n-type semiconductor region, spaced from the source region. The source region and the contact region can be connected to one end of the current-limiting resistor, and the drain region can be connected to one end of the level shift resistor, the other end of the level shift resistor can be connected to the low-potential side of the high-voltage power supply, and the other end of the current-limiting resistor can be connected to the high-potential side of the low-voltage power supply.

In another embodiment, the MOSFET can include an n-type semiconductor region in the p-type semiconductor substrate and connected to the high potential of the low-voltage power supply with the another main terminal of the power device as a reference, a p-type base region selectively placed in the n-type semiconductor region, the source region of an n-type source region selectively placed in the base region, a p-type contact region selectively placed adjacent to the source region in the base region, and the drain region of an n-type drain region selectively placed in the n-type semiconductor region, spaced from the base region. The source region and the contact region can be connected to the low-potential side of the high-voltage power supply, and the drain region can be connected to one end of the current-limiting resistor, the other end of the current-limiting resistor can be connected to one end of the level shift resistor, and the other end of the level shift resistor can be connected to the high-potential side of the low-voltage power supply with the another main terminal of the power device as a reference.

In another embodiment, the MOSFET can include a second n-type semiconductor insulation-isolated region in the p-type semiconductor substrate and connected to the high potential of the low-voltage power supply with the another main terminal of the power device as a reference, the source region of a p-type source region selectively placed in the second n-type semiconductor region, an n-type contact region selectively placed adjacent to the source region, and the drain region of a p-type drain region selectively placed in the second n-type semiconductor insulation-isolated region, spaced from the source region. The source region and the contact region can be connected to the high-potential side of the low-voltage power supply with the another main terminal of the power device as a reference, and the drain region can be connected to one end of the current-limiting resistor, the other end of the current-limiting resistor can be connected to one end of the level shift resistor, and the other end of the level shift resistor can be connected to the low-potential side of the high-voltage power supply. The first n-type semiconductor insulation-isolated region and the second n-type semiconductor insulation-isolated region can be the same region.

The level shift circuit can include an ESD protection diode and a Zener diode reversely connected in series, with the serially connected ESD protection diode and the Zener diode connected in parallel with the current-limiting resistor, with an anode side of the ESD protection diode at the low-potential side of the high-voltage power supply.

The high-potential side low-voltage circuit region can be in the n-type semiconductor region. The n-type semiconductor region can be an insulation-isolated region, surrounded by an insulating region.

BRIEF DESCRIPTION OF THE DRAWINGS

FIG. 9 schematically illustrates junction breakdown of a pn junction under diffusion resistance.

FIGS. 14A and 14B illustrate circuit diagrams of a third embodiment of the level shift circuit according to the present invention, FIG. 14A illustrating a level-up circuit diagram, and FIG. 14B illustrating a level-down circuit diagram.

FIGS. 20A and 20B illustrate detailed level shift circuit diagrams of a conventional semiconductor device (HVIC), FIG. 20A illustrating a level-up circuit diagram, and FIG. 20B illustrating a level-down circuit diagram.

DETAILED DESCRIPTION

Figure 1A:
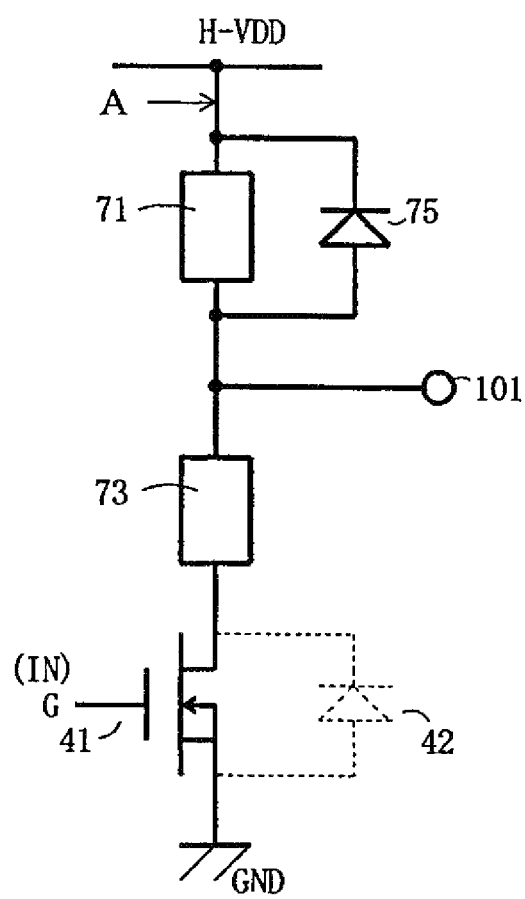
FIGS. 1A and 1B illustrate circuit diagrams of a first embodiment of the level shift circuit according to the present invention, FIG. 1A illustrating a level-up circuit diagram, and FIG. 1B illustrating a level-down circuit diagram.

Referring to FIG. 1A, the first embodiment of the level-up circuit comprises a level shift resistor 71, a current-limiting resistor 73 connected to the level shift resistor 71, and n-channel MOSFET 41 with its drain connected to the current-limiting resistor 73. The portion between the level shift resistor 71 and the current-limiting resistor 73 is an output portion 101 of the level-up circuit. To prevent the level shift resistor 71 from failing when the H-VDD is at a much lower potential than the GND potential, a diode 75 is connected in parallel with the level shift resistor 71. Also, the n-channel MOSFET 41 incorporates a body diode 42 (shown in phantom) reversely connected in parallel.

Figure 1B:
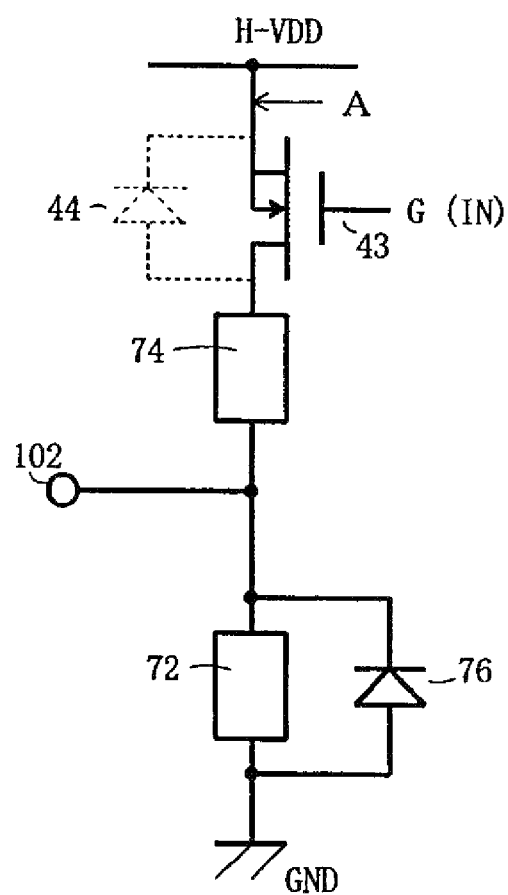

Referring to FIG. 1B, the first embodiment level-down circuit comprises a p-channel MOSFET 43, a current-limiting resistor 74 connected to its drain, and a level shift resistor 72 connected in series to the current-limiting resistor 74. The portion between the level shift resistor 72 and the current-limiting resistor 74 is an output portion 102 of the level-down circuit. To prevent the level shift resistor 72 from failing when the H-VDD is at a much lower potential than the GND potential, a diode 76 is connected in parallel with the level shift resistor 72. Further, the n-channel MOSFET 43 incorporates a body diode 44 (shown in phantom) reversely connected in parallel. Alternatively, the current-limiting resistors 73, 74 can be connected at position A instead.

By providing the current-limiting resistors 73, 74, even when an excessive negative potential of −100 V relative to the GND potential is applied to the H-VDD, the excessive current flows through the body diode 42 of the n-channel MOSFET 41 or in the body diode 76 of the p-channel MOSFET, thus preventing failure.

The resistance values of the current-limiting resistors 73, 74 can be approximately $\frac{1}{10}$ to $\frac{1}{100}$ the resistance values of the level shift resistors 71, 72, and are chosen to suppress the current flowing in the body diodes 42, 44 and maintain current values so that there is no failure of the body diodes 42, 44. For example, if the resistance value of the level shift resistors 71, 72 is 10 kΩ, then the resistance value of the current-limiting resistors 73, 74 can be approximately 100 Ω. To ensure that the body diodes 42, 44 do not fail at these resistance values, still smaller values can be used. At these resistance values, the effect on the rise time and fall time of signals input to the high-side circuit C-MOS circuit due to connection of the current-limiting resistors 73, 74 is small.

Figure 2:
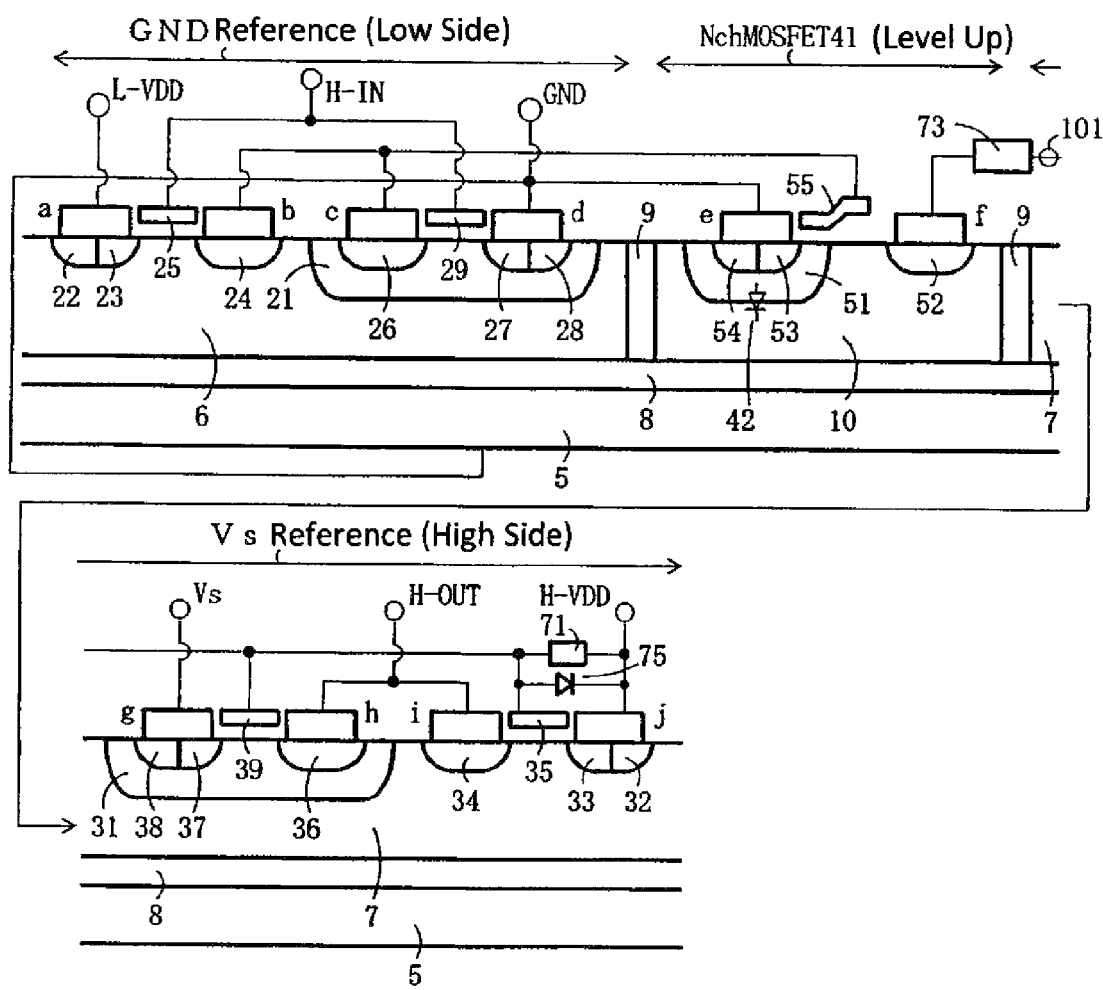
FIG. 2 schematically illustrates a cross-sectional view according to a first embodiment of a semiconductor device embodying the level-up circuit of FIG. 1A.
Figure 3:
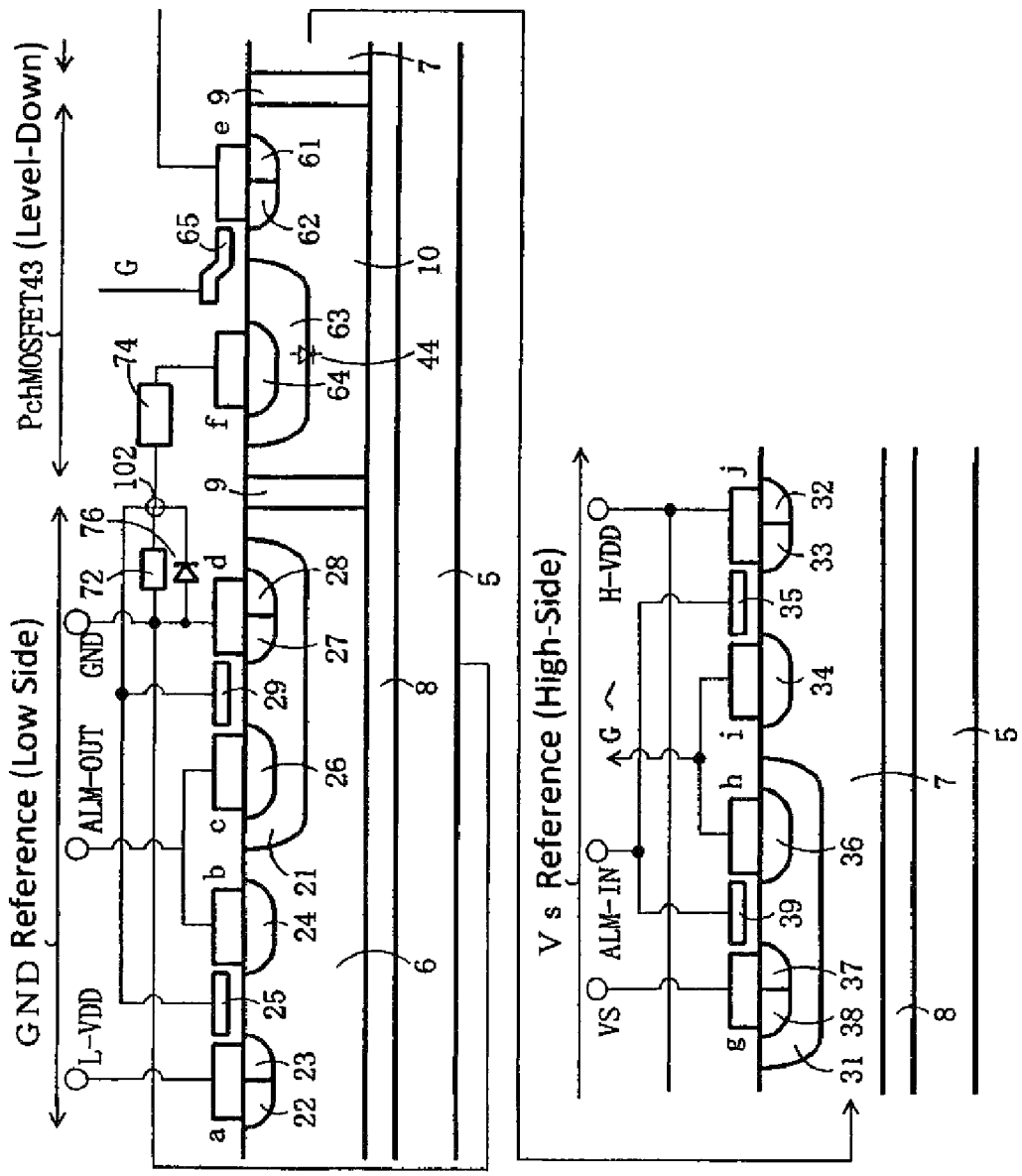
FIG. 3 schematically illustrates a cross-sectional view of according to a first embodiment of a semiconductor device embodying the level-down circuit of FIG. 1B.

FIGS. 2 and 3 illustrate the semiconductor device embodying the low-side circuit and high-side circuit connected to the level-up circuit and level-down circuit. A SOI substrate can be used. On the surface of an n-type substrate 5 (p-type substrate also can be used), an n region is formed with an insulating film 8 intervening other regions. In FIG. 2, an insulating films 9, which extend from the insulating film 8, are positioned to divide the n region of the SOI substrate into three portions, namely an n region 6 serving as the GND reference, an n region 7 serving as a Vs reference, and an n region 10 of the level-up MOSFET 41 positioned between the n regions 6 and 7. This n-channel MOSFET 41 is formed within the n region 10, with a drain region 52 of the n-channel MOSFET connected to the H-VDD with the current-limiting resistor 73 and the level shift resistor 71, such as with a metal wiring. In addition, the connection portion of the two resistors 73 and 71 serves as the output portion 101 of the level-up circuit.

Figure 7A:
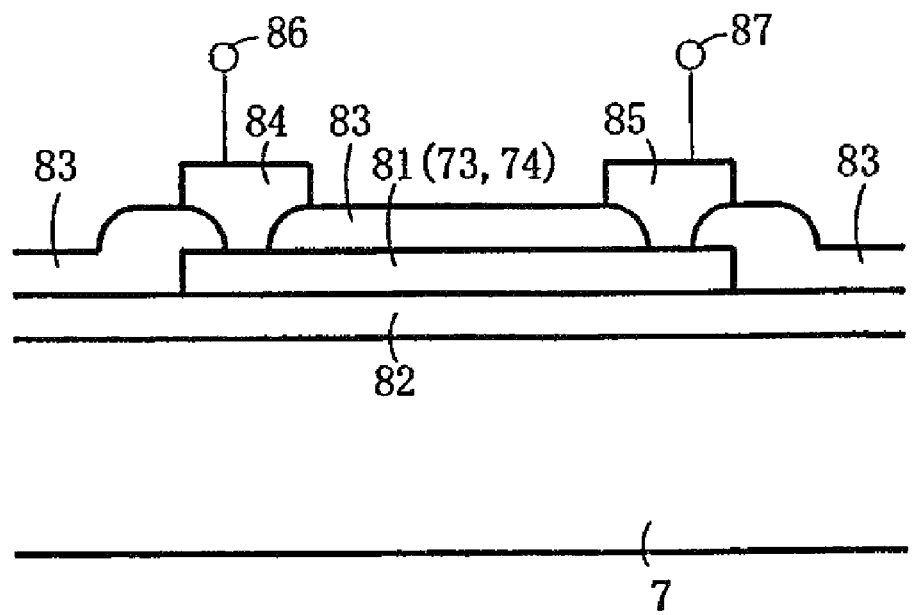
FIGS. 7A and 7B schematically illustrate cross-sectional views of principal portions of the semiconductor device at the location of a current-limiting resistor, FIG. 7A illustrating a polysilicon film, and FIG. 7B illustrating a diffusion in the surface layer of the substrate.
Figure 7B:
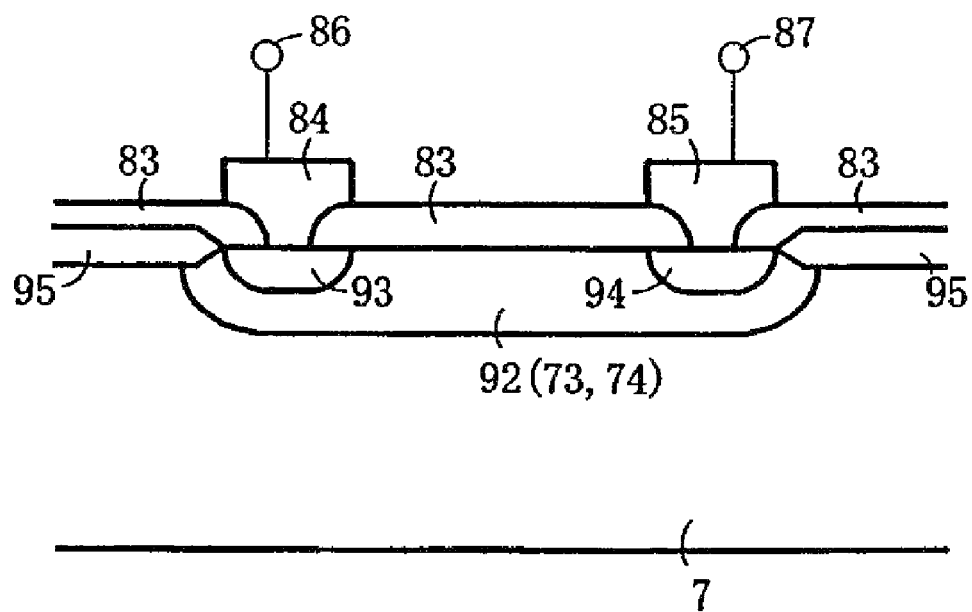

The n-channel MOSFET 41 can be fabricated by forming a p region 51 in the surface layer of the n region 10, forming an n source region 53 and a p contact region 54 in the surface layer of the p region, forming a gate electrode 55 on the p region 51 extending between the n source region 53 and the n region 10, with an insulating film intervening, and forming the n drain region 52 in the surface layer of the n region 10, spaced from the p region 51. A source electrode e is formed on the n source region 53 and the p contact region 54, and a drain electrode f is formed on the n drain region 52. The current-limiting resistor 73 connected to this drain electrode f is formed by means of a polysilicon film 81 as shown in FIG. 7A and a diffusion resistance 92 as shown in FIG. 7B. The level shift resistor 71 and diode 75 can be formed using a normal polysilicon film.

Low-side CMOS elements are formed in the low-side n region 6. The CMOS n-channel MOSFET can be fabricated by forming a p region 21 in the surface layer of the n region 6, forming an n source region 27, a p contact region 28, and an n drain region 26 in the surface layer of the p region 21, forming a gate electrode 29 on the p region 21 extending between the n source region 27 and the n drain region 26 with an insulating film (not shown), intervening, forming a source electrode d on the n source region 27 and the p contact region 28, and forming a drain electrode c on the n drain region 26. The CMOS p-channel MOSFET can be fabricated by forming a p drain region 24, a p source region 23, and an n contact region 22 in the surface layer of the n region 6 spaced from the p region 21, forming a drain electrode b on the p drain region 24, and forming a source electrode a on the p source region 23 and the n contact region 22.

Referring to FIG. 3, the insulating films 9, which extend from the insulating film 8, are positioned to divide the n region of the SOI substrate namely into an n region 6 with the GND as reference, an n region 7 with Vs as a reference, and an n region 10 of the level-down MOSFET. Using a metal wiring, the drain of the p-channel MOSFET is connected to the GND via the current-limiting resistor 74 and the level shift resistor 72. The portion between the two resistors 74, 72 becomes the output portion 102 of the level-down circuit. The current-limiting resistor 74, which is connected to the drain electrode f, can be formed with a polysilicon film 81 shown in FIG. 7A and a diffusion resistance 92 shown in FIG. 7B. The level shift resistors 71, 72 and the diodes 75, 76 shown in FIG. 2 and FIG. 3 can be formed using a normal polysilicon film.

In a semiconductor device (HVIC) in which the above level shift circuit has been formed, a signal transmission is possible in both the level-up circuit and the level-down circuit during its normal operation, and by using the current-limiting resistors 73, 74 to limit the forward-direction current in the body diodes 42, 44 of the level shift MOSFETs even when the potential of the terminal Vs is lower than the GND potential, failure or malfunction of the semiconductor device can be prevented.

The low-side low-voltage circuit region, high-side low-voltage circuit region, and level shift circuit can be fabricated on separate chips, and connecting them with wires. In this case also, the current-limiting resistors can be inserted at locations (A) similarly as shown in FIGS. 1A and 1B.

Figure 4:
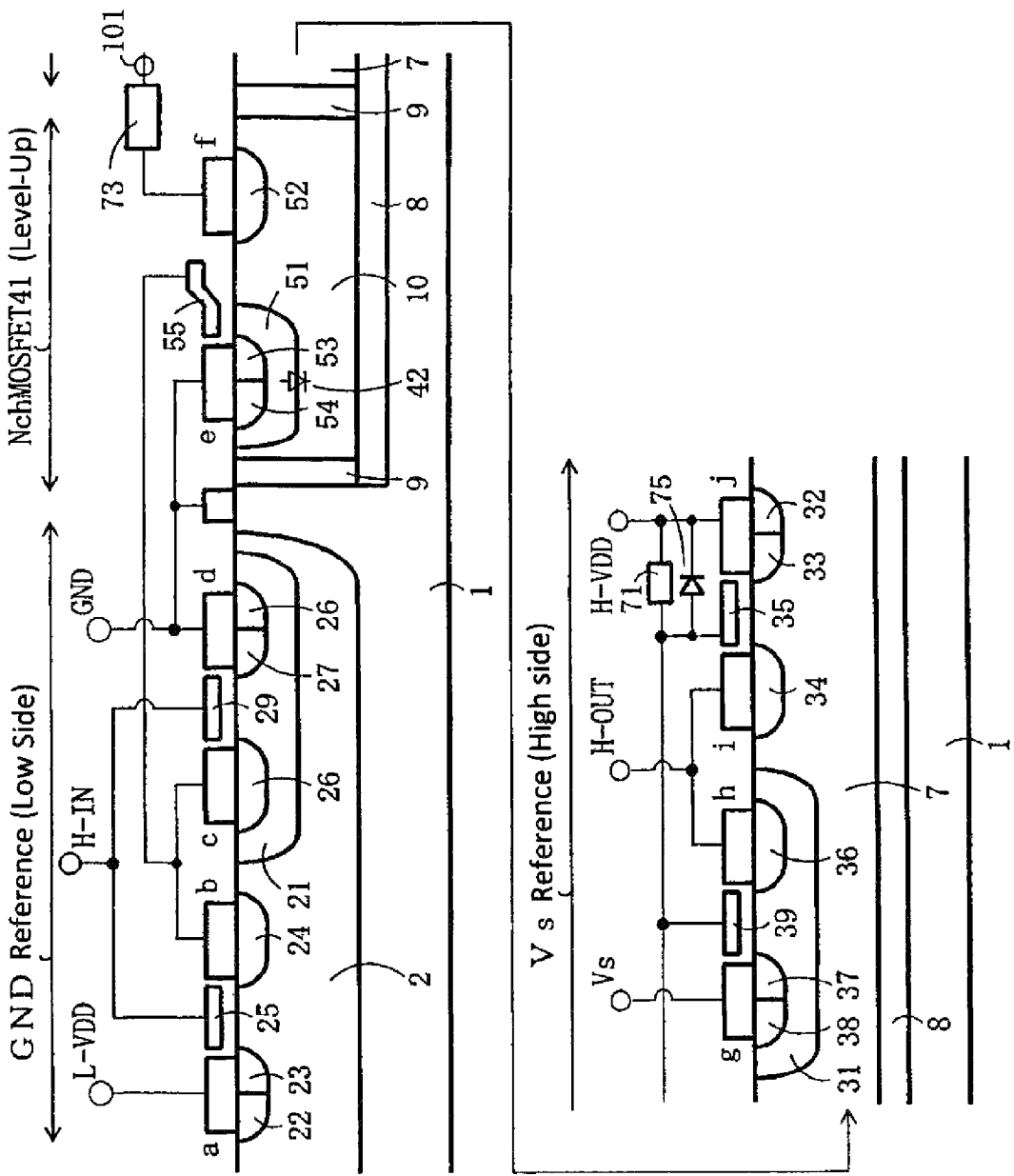
FIG. 4 schematically illustrates a cross-sectional view according to a second embodiment of the semiconductor device embodying the level-up circuit.

Referring to FIG. 4, the second embodiment of the level-up circuit is different from FIG. 2 in that the CMOS circuits of the GND reference circuits are formed in the surface layer of an n-well region 2 formed in the surface layer of a p substrate 1, and that the n region 7 and n region 10 are formed on the p substrate 1 with the insulating films 8, 9 similar to FIG. 2. In this embodiment, only the level-up circuit is shown, but the level-down circuit can similarly be fabricated with the ground reference CMOS circuit of FIG. 3 formed in the surface layer of the n-well region formed in the surface layer of the p substrate 1.

In the semiconductor device formed according to FIG. 4, similarly to FIG. 2, by limiting the forward-direction current in the body diode 42 of the level shift MOSFET even when the potential at the Vs terminal is lower than the GND potential, failure or malfunction of the semiconductor device can be prevented.

Figure 5:
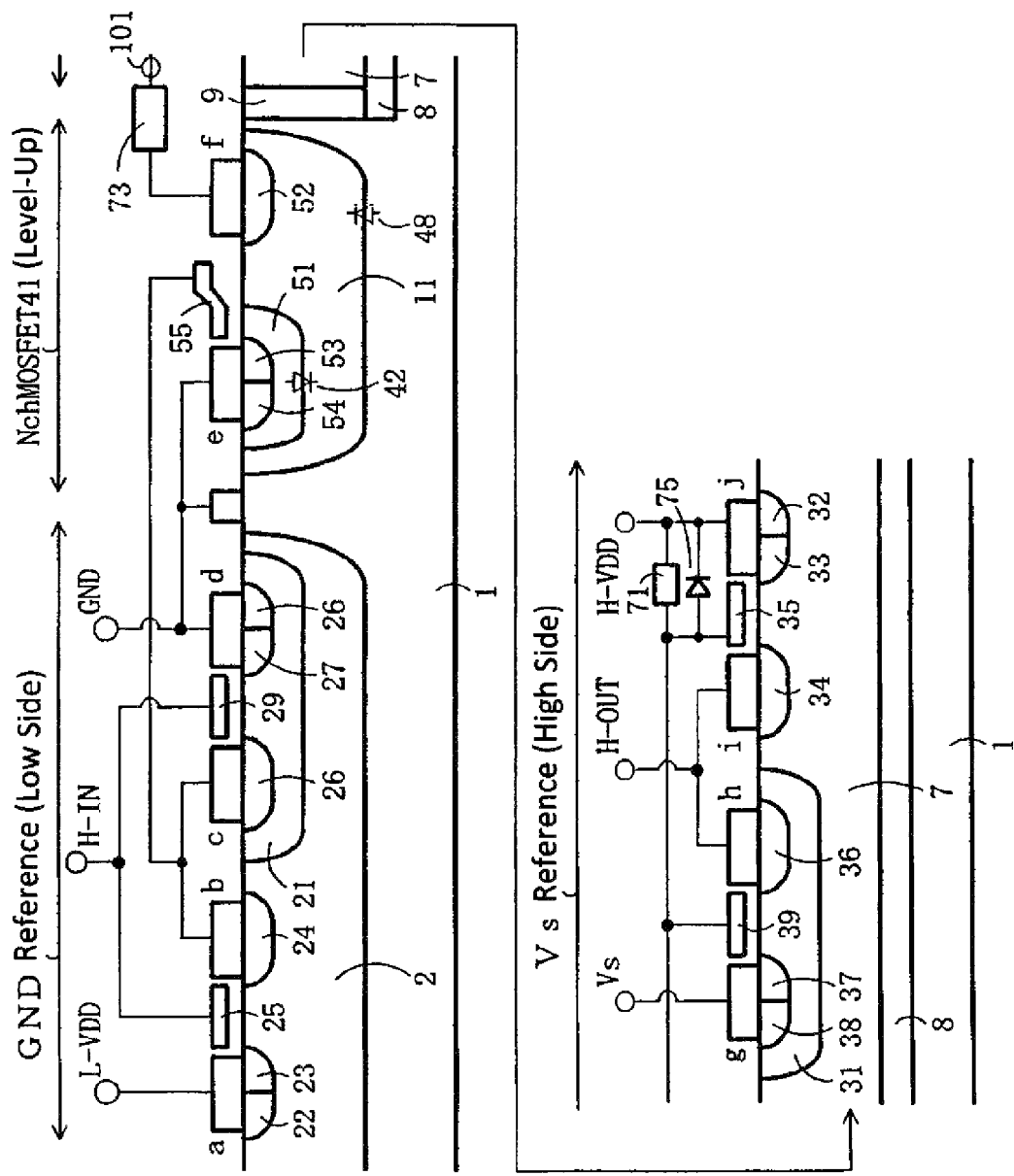
FIG. 5 schematically illustrates a cross-sectional view according to a third embodiment of the semiconductor device embodying the level-up circuit.

Referring to FIG. 5, the third embodiment of the level-up circuit is different from FIG. 2 in that the GND reference circuit CMOS circuit is formed in the n-well region 2 of the surface layer of the p substrate 1, the level-up n-channel MOSFET 41 is formed in an n-well region 11, and that the n region 7 is formed on the p substrate with insulating films 8, 9.

In the semiconductor device according to FIG. 5, similarly to FIG. 2, failure or malfunction of the semiconductor device can be prevented even when the potential at the Vs terminal is lower than the GND potential by limiting the forward-direction current in the body diode 42 of the level shift MOSFET and also by limiting the forward-direction current in a parasitic diode 48.

Figure 6:
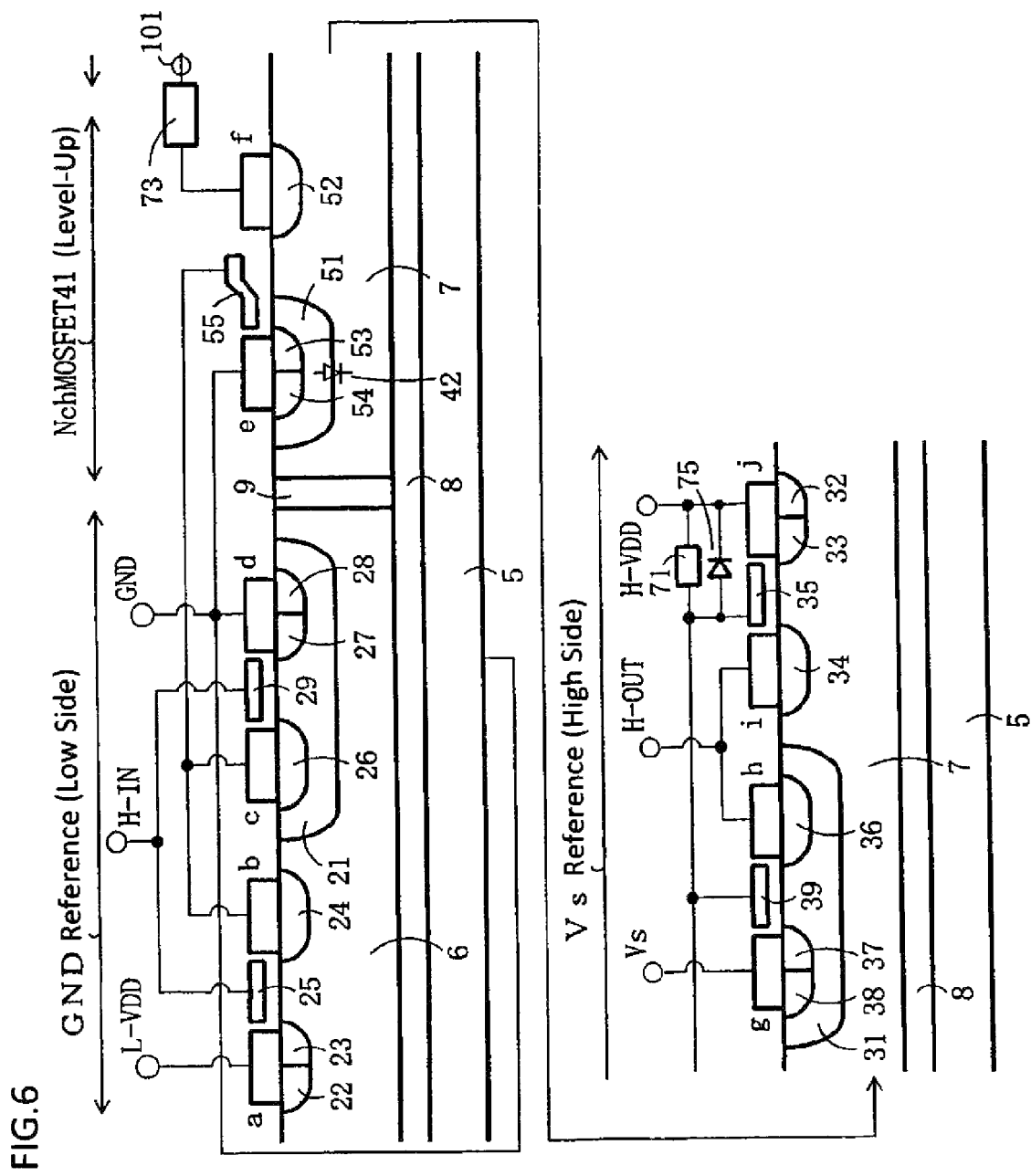
FIG. 6 schematically illustrates a cross-sectional view according to a fourth embodiment of the semiconductor device embodying the level-up circuit.

FIG. 6, the fourth embodiment of the level-up circuit is different from FIG. 2 in that the level-up n-channel MOSFET 41 is formed in the same n region 7 as the high-side region. Also, while only the level-up circuit is illustrated, the level-down circuit also can be similarly formed in the n region 7 of the n-channel MOSFET 41 of FIG. 3.

In FIG. 6, because the n-well region 7 is at H-VDD potential, the distance between the level-up n-channel MOSFET 41 and the circuit portion (C-MOS portion) must be made large, and the lateral-direction resistance of the n-well region 7 is set larger than the sum of the resistances of the current-limiting resistor 73 and the level shift resistor 71.

In the semiconductor device according to FIG. 6, similarly to FIG. 2, by limiting the forward-direction current in the body diode 42 of the level-up MOSFET even when the potential at the Vs terminal is lower than the GND potential, failure or malfunction of the semiconductor device can be prevented.

Figure 8:
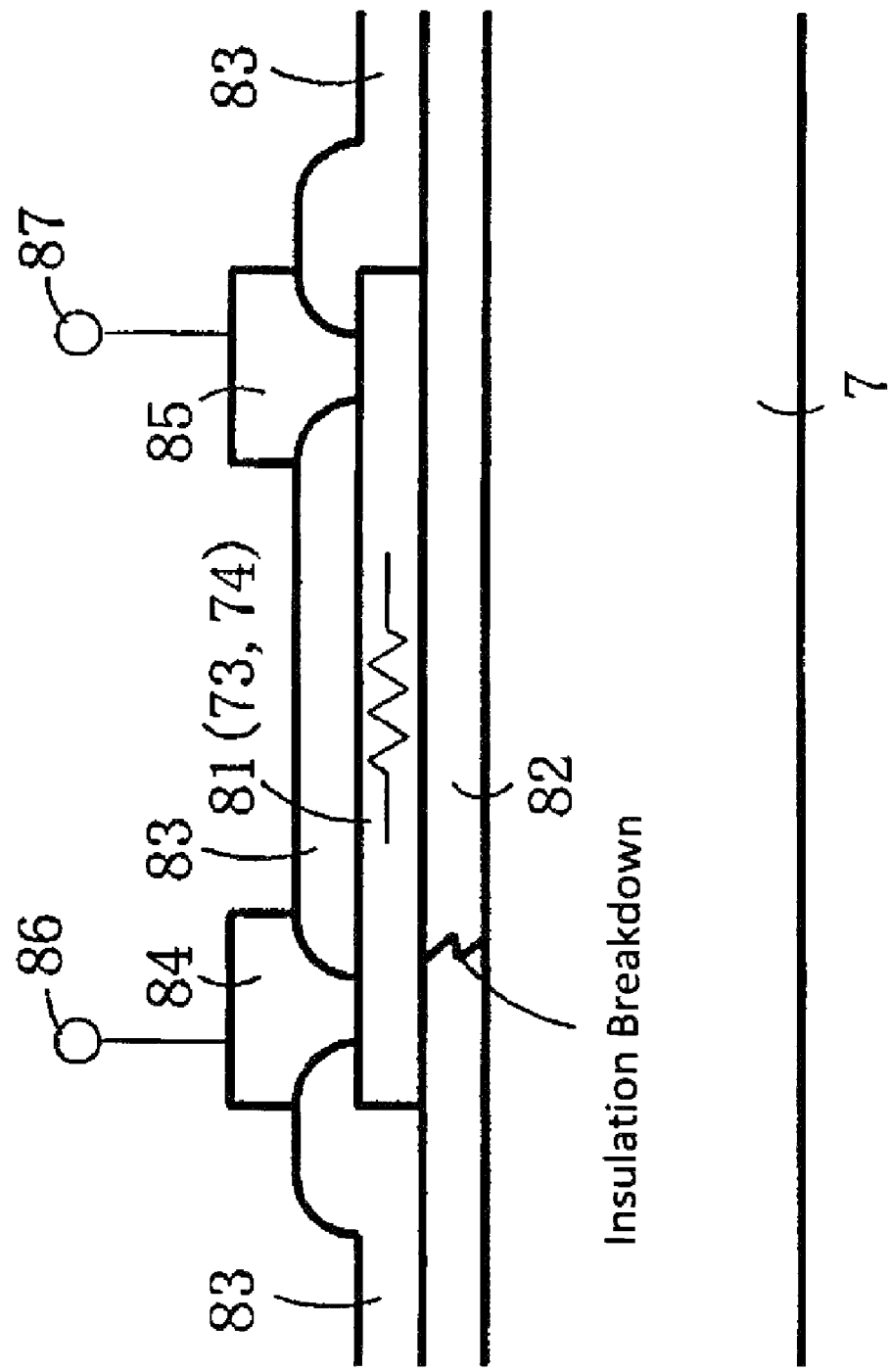
FIG. 8 schematically illustrates insulation breakdown of the insulation film below the polysilicon film.

The method of forming the current-limiting resistor for the above embodiments follows. Referring to FIGS. 7A and 7B, when an ESD surge is applied to the H-VDD terminal or to the Vs terminal, an excessive current flows in the current-limiting resistors 73, 74, and an excessive voltage appears across the current-limiting resistors 73, 74. When these current-limiting resistors 73, 74 are formed using polysilicon film 81 as shown in FIG. 7A, insulation breakdown of the insulation film 82 below this polysilicon film 81 occurs, as shown in FIG. 8, and the current-limiting resistors 73, 74 are electrically connected with the circuits formed in the n region 7, resulting in the semiconductor device failing or malfunctioning. When the resistors are formed using diffusion resistance 92 as shown in FIG. 7B, the diffusion resistance 92 can be burned out, or insulation breakdown of the pn junction between the region of the diffusion resistance 92 and the n region 7 (junction breakdown) can occur, as illustrated in FIG. 9, resulting in similar problems.

Figure 10A:
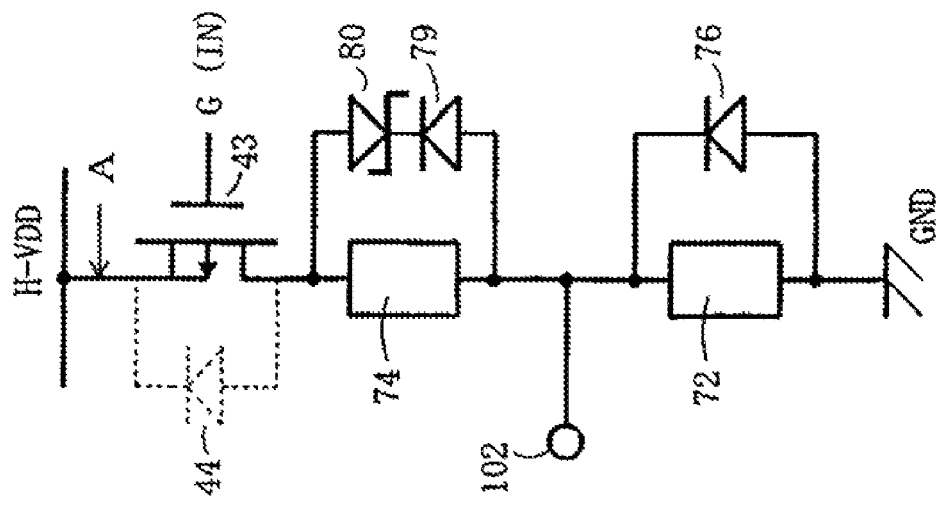
FIGS. 10A and 10B illustrate circuit diagrams of a second embodiment of the level shift circuit according to the present invention, FIG. 10A illustrating a level-up circuit diagram, and FIG. 10B illustrating a level-down circuit diagram.
Figure 10B:
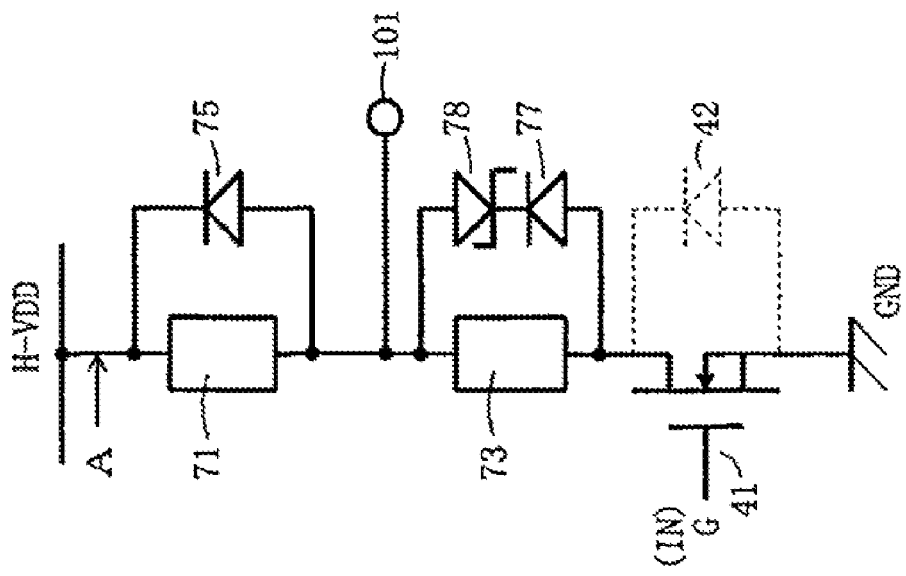

The embodiment of FIGS. 10A and 10B is used to explain the method of forming the current-limiting resistors 73, 74 to prevent failure of the semiconductor device when an ESD surge is input to the H-VDD terminal or Vs terminal. FIGS. 10A and B illustrate the circuit diagrams of the second embodiment of the level shift circuit. The difference between this embodiment and FIGS. 1A and 1B is that circuits, in which ESD protection diodes 77, 79 and Zener diodes 78, 80 reversely connected in series, are connected in parallel with the current-limiting resistors 73, 74. With this configuration, when a positive or negative ESD surge is applied to H-VDD, the ESD current is discharged through the ESD protection diodes 77, 79 and Zener diodes 78, 80 so that no excessive voltage is applied to the current-limiting resistors 73, 74, preventing their failure.

Moreover, the action of the Zener diodes 78, 80 prevents excessive currents from flowing in the diodes, and when, during normal operation with an L load, a voltage of for example −100 V is applied to H-VDD, the ESD protection diodes 77, 79 are forward-biased, and the current-limiting resistors 73, 74 no longer are loaded with the voltage. When the current-limiting resistors 73, 74 are formed using polysilicon film 81, the ESD protection diodes 77, 79 and Zener diodes 78, 80 prevent the application of an excessive voltage across the current-limiting resistors 73, 74 when an ESD surge is applied, and act to prevent insulation breakdown of the insulating film 82 below the polysilicon film 81 shown in FIG. 7A. Further, when the current-limiting resistors 73, 74 are fabricated using diffusion resistances 92, burning out of the diffusion resistances 92 shown in FIG. 7B can be prevented. Also, junction failure of the pn junction formed by the region forming the diffusion resistance 92 (p region) and the n region 7 can be prevented.

As explained above, the resistance values of the current-limiting resistors 73, 74 can be set to approximately $\frac{1}{10}$ to $\frac{1}{100}$ the resistance values of the level shift resistors 71, 72, to prevent failure of the body diodes 42, 44. For example, when the resistance values of the level shift resistors 71, 72 are set to approximately 10 kΩ in order to reduce power consumption, the resistance values of the current-limiting resistors 73, 74 are set to approximately 100Ω. If, for these resistance values, excessive currents flow in the body diodes 42, 44 causing failure, the resistance values can be further increased. However, if the values are too high, the voltage at the level shift output portions 101, 102 becomes too high, and instability can result in the high-side circuit C-MOS circuit or low-side circuit C-MOS circuit. Accordingly, it is preferable that the resistance values be kept within the above range.

Also, during normal operation with an L load, the Vs terminal is drawn down by approximately 100 V, and so the Zener voltages of the Zener diodes 78, 80 are set to approximately 100 V. Moreover, similar advantageous results are obtained if the current-limiting resistors 73, 74 and the circuits formed by the ESD protection diodes 77, 79 and Zener diodes 78, 80 are connected at location A.

Figure 11:
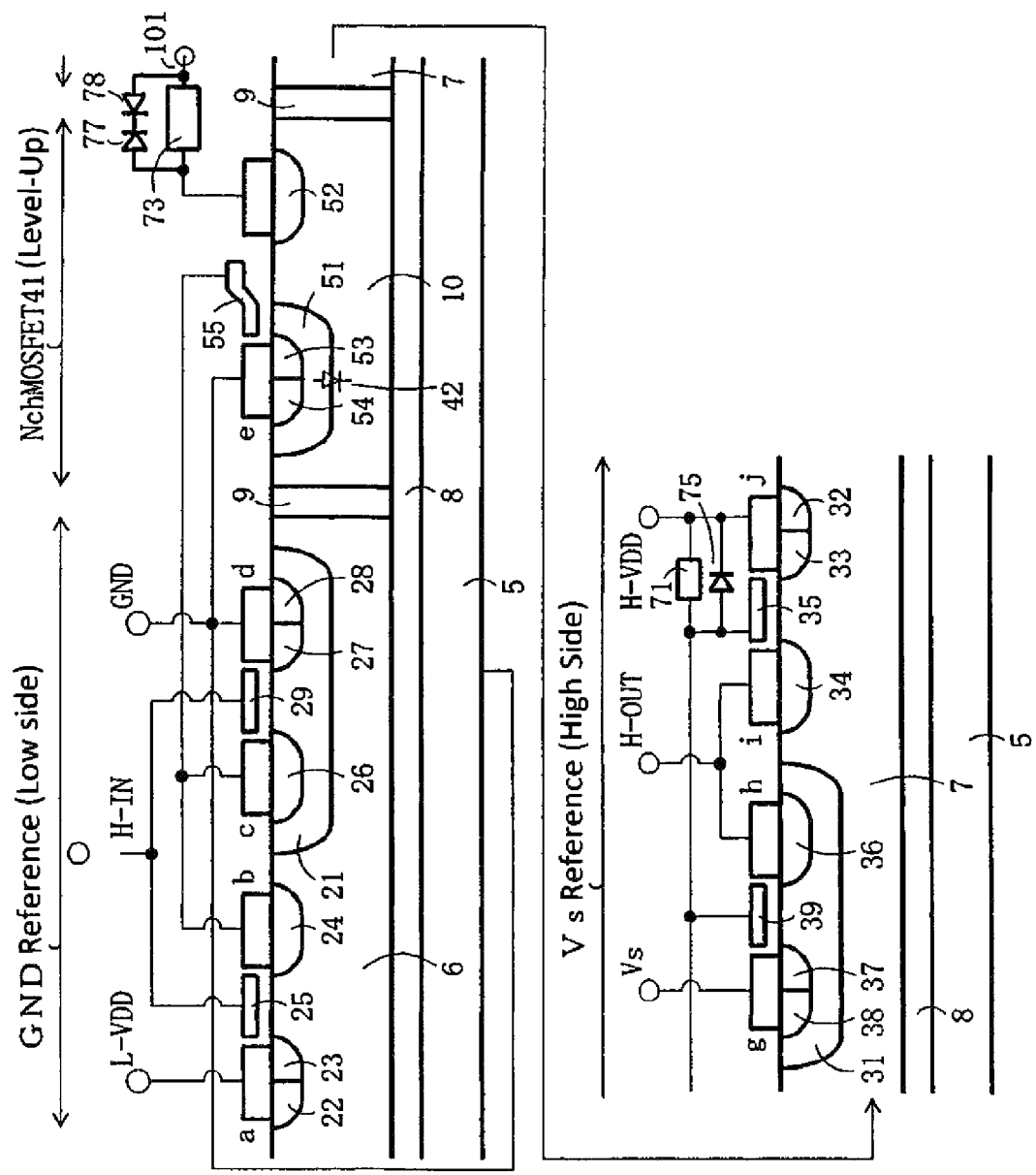
FIG. 11 schematically illustrates a cross-sectional view of a fifth embodiment of the semiconductor device embodying the level-up circuit of FIG. 10A.
Figure 12:
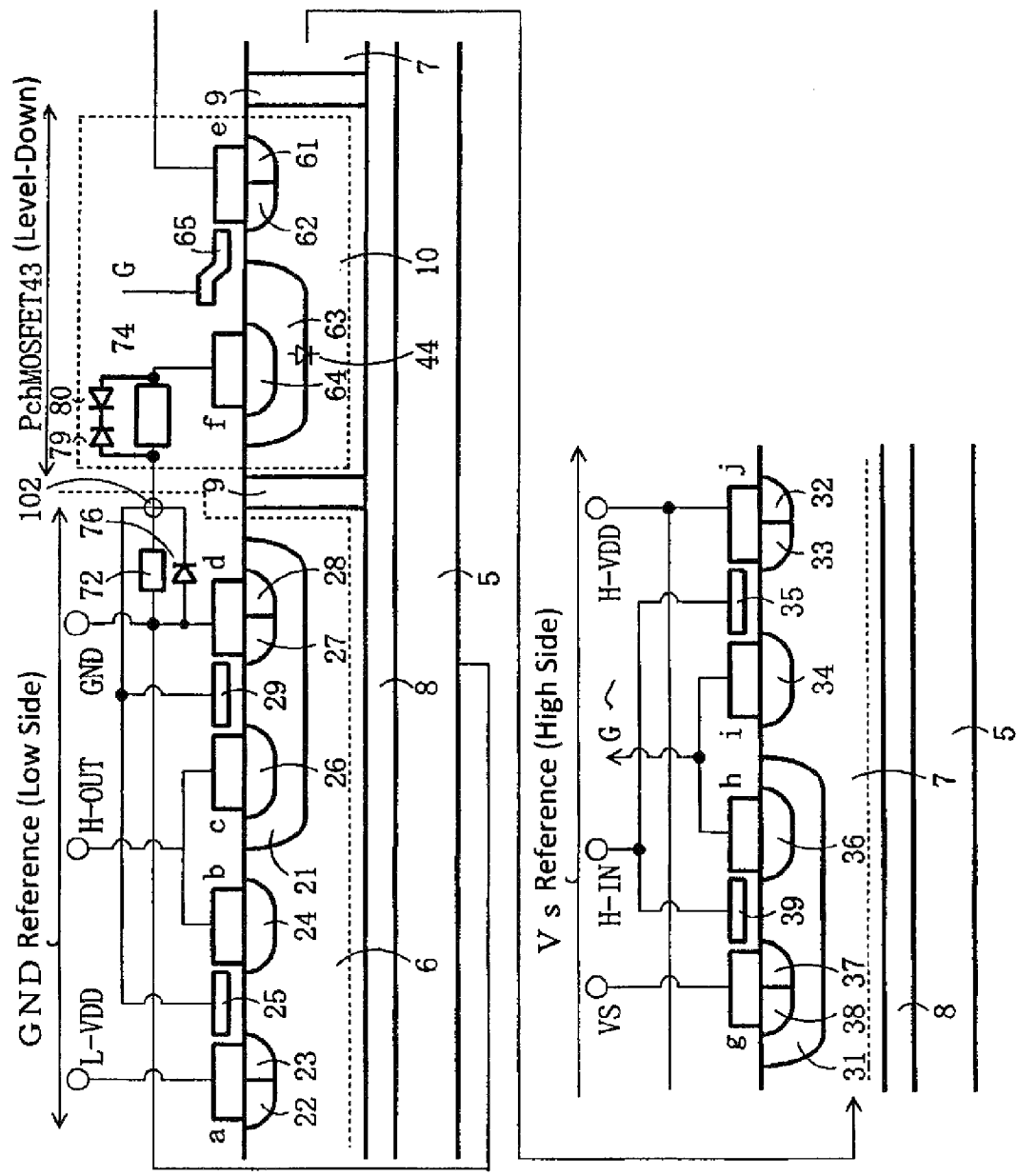
FIG. 12 schematically illustrates a cross-sectional view according to a second embodiment of the semiconductor device embodying the level-down circuit of FIG. 10B.
Figure 13:
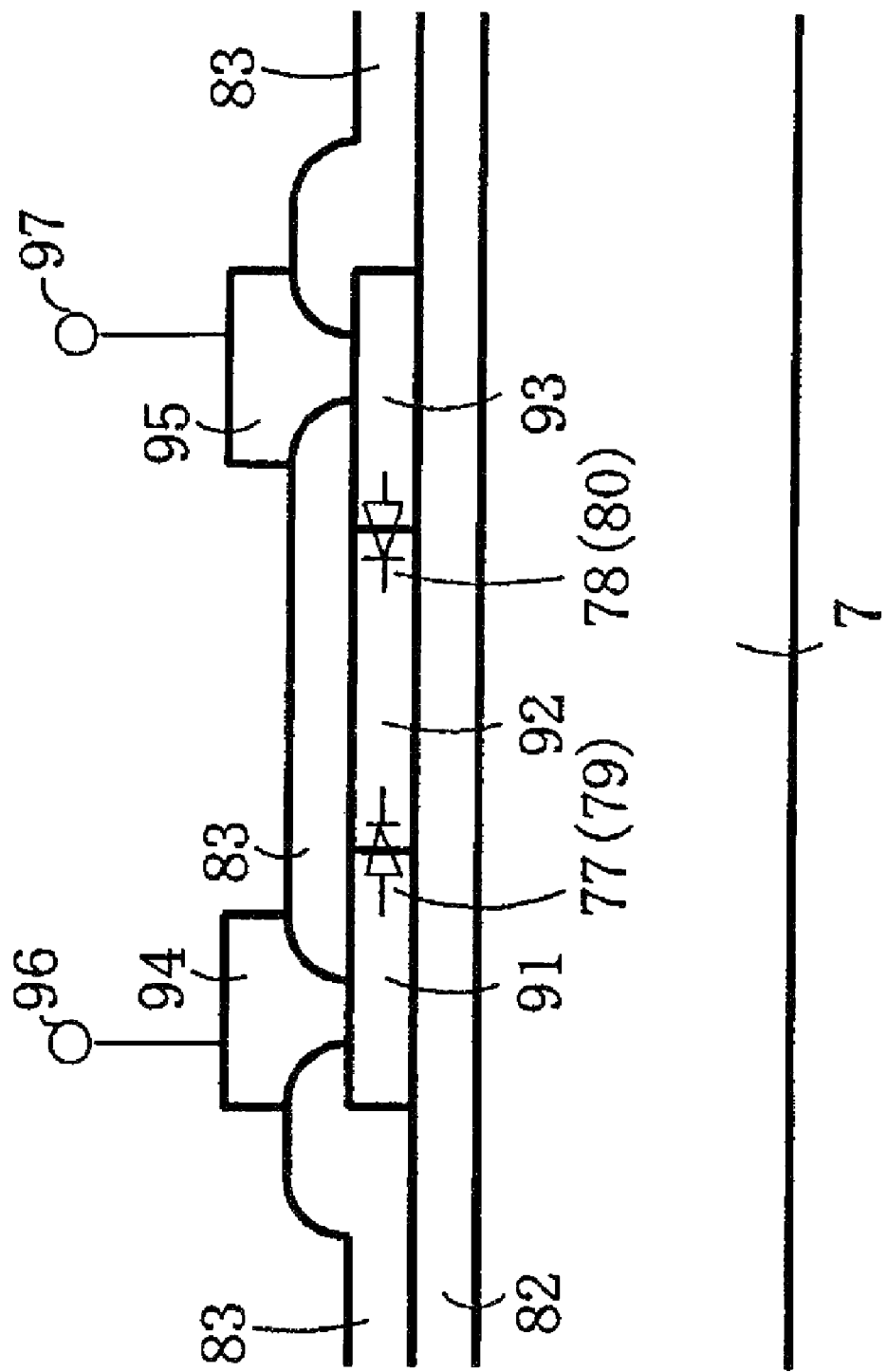
FIG. 13 schematically illustrates a cross-sectional view of principal portions of the ESD protection diode and a Zener diode formed with a polysilicon film.

Referring to FIGS. 11 and 12, these embodiments are different from FIG. 2 and FIG. 3 in that the ESD protection diodes 77, 79, which are connected in parallel with the current-limiting resistors 73, 74, and the Zener diodes 78, 80 are reverse-series connected, are formed in the n-region 7. As shown in FIG. 13, the ESD diodes 77, 79 and Zener diodes 78, 80 are fabricated by forming p type, n type, and p type polysilicon films 91, 92, 93 in contact on the insulating film 82. In FIGS. 11 and 12, the n region can be the same region as the n-region 7, as in FIG. 6. Further, the n-region 6 can be a junction-isolation region rather than an insulation-isolation region. Also, in FIG. 11, the n-region 10 can be a junction-isolation region like the n-well region 11 in FIG. 5.

In the insulation-isolation elements described above, when the current-limiting resistors 73, 74 are connected to the drains of MOSFETs 41, 43, at least the high-side region (n-region 7) should be an insulation-isolation region surrounded by an insulating region.

In the cases of the insulation-isolation devices described above, the circuits comprising the above-described current-limiting resistors 73, 74 or current-limiting resistors 73, 74 and ESD protection diodes 77, 79 and the Zener diodes 78, 80 need not be connected at the locations indicated in the embodiments, but can be provided at any location in the path connecting the ground terminal and H-VDD terminal (locations A in FIGS. 1A, 1B, 10A and 10B).

The above embodiments use insulation-isolation elements. In the following embodiments, junction-isolation elements are used. Referring to FIGS. 14A and 14B, these embodiments are different from FIGS. 1A, 1B and FIGS. 10A, 10B in that the current-limiting resistors 73, 74 are connected at different locations so that their output portions are located at D, to the high-voltage terminal 120 rather than to the ground terminal. The level-shift circuit and the high-side CMOS circuit are connected, via current-limiting resistors 73, 74, to this high-voltage power supply terminal 120. When an ESD surge is input, excessive currents can be kept from flowing in the parasitic diodes 45, 46, and failure or malfunction of the semiconductor device can be prevented.

Figure 15:
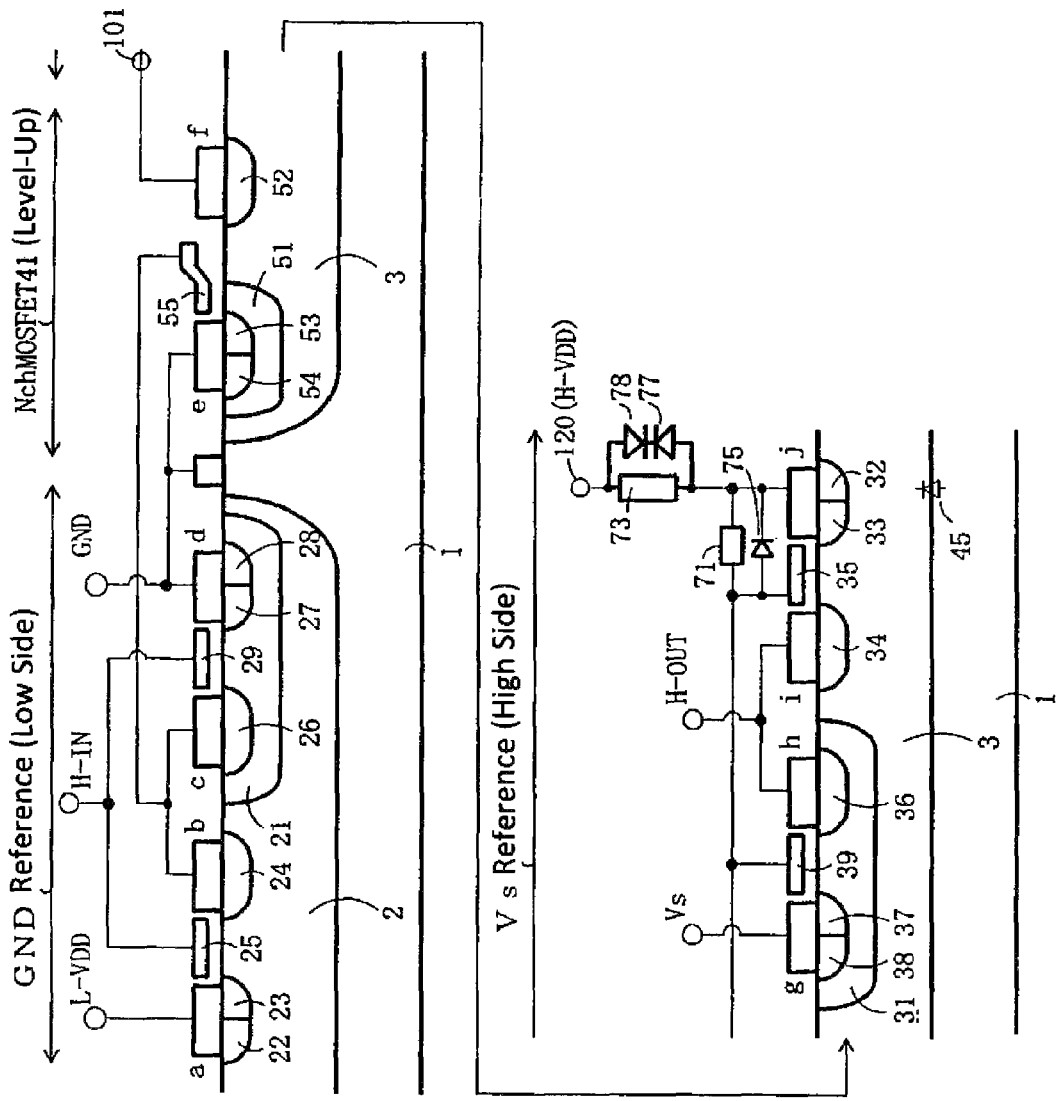
FIG. 15 schematically illustrates a cross-sectional view according to a sixth embodiment of the semiconductor device embodying the level-up circuit of FIG. 14A.
Figure 16:
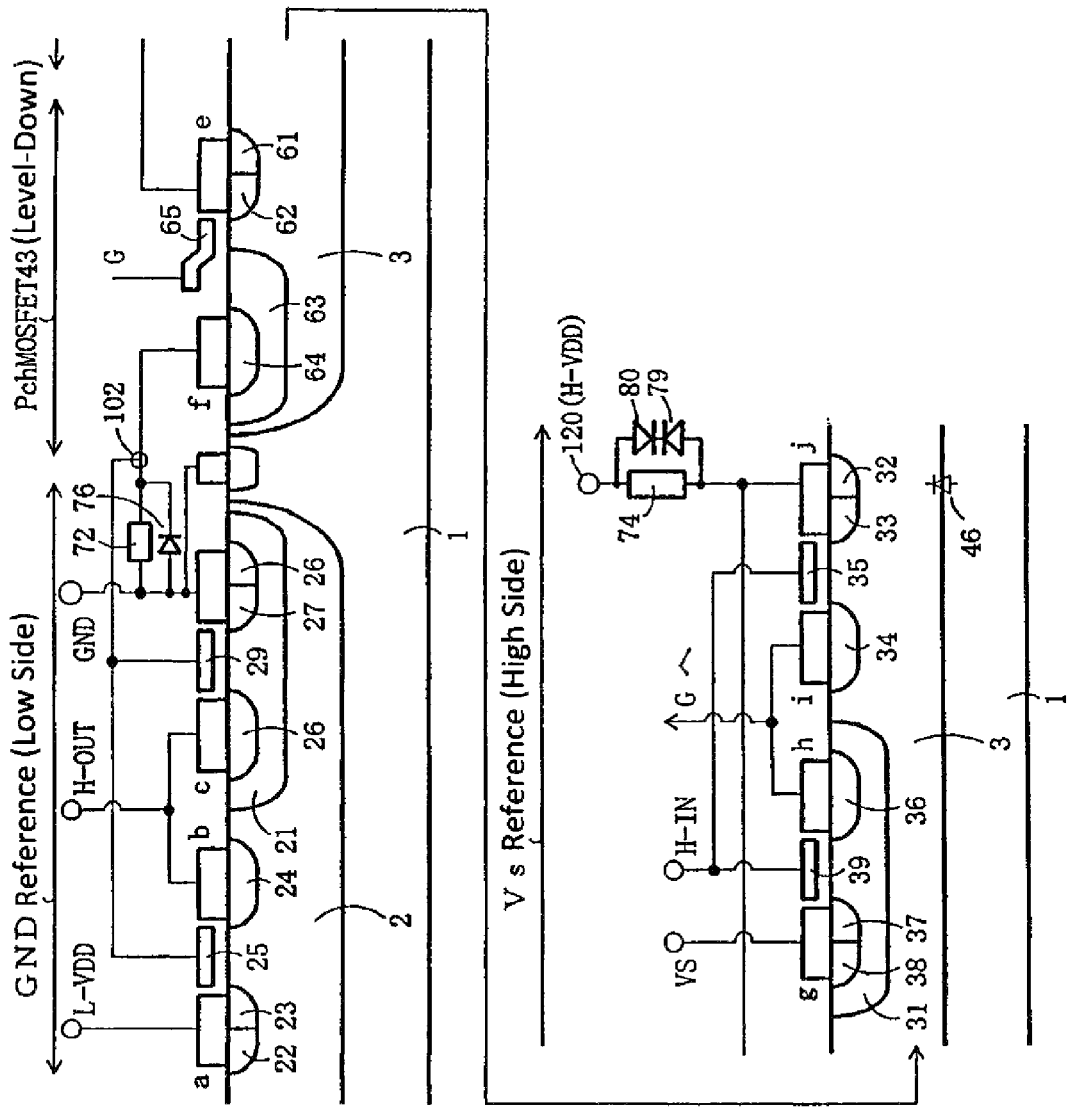
FIG. 16 schematically illustrates a cross-sectional view according to a third embodiment of the semiconductor device embodying the level-down circuit of FIG. 14B.
Figure 17:
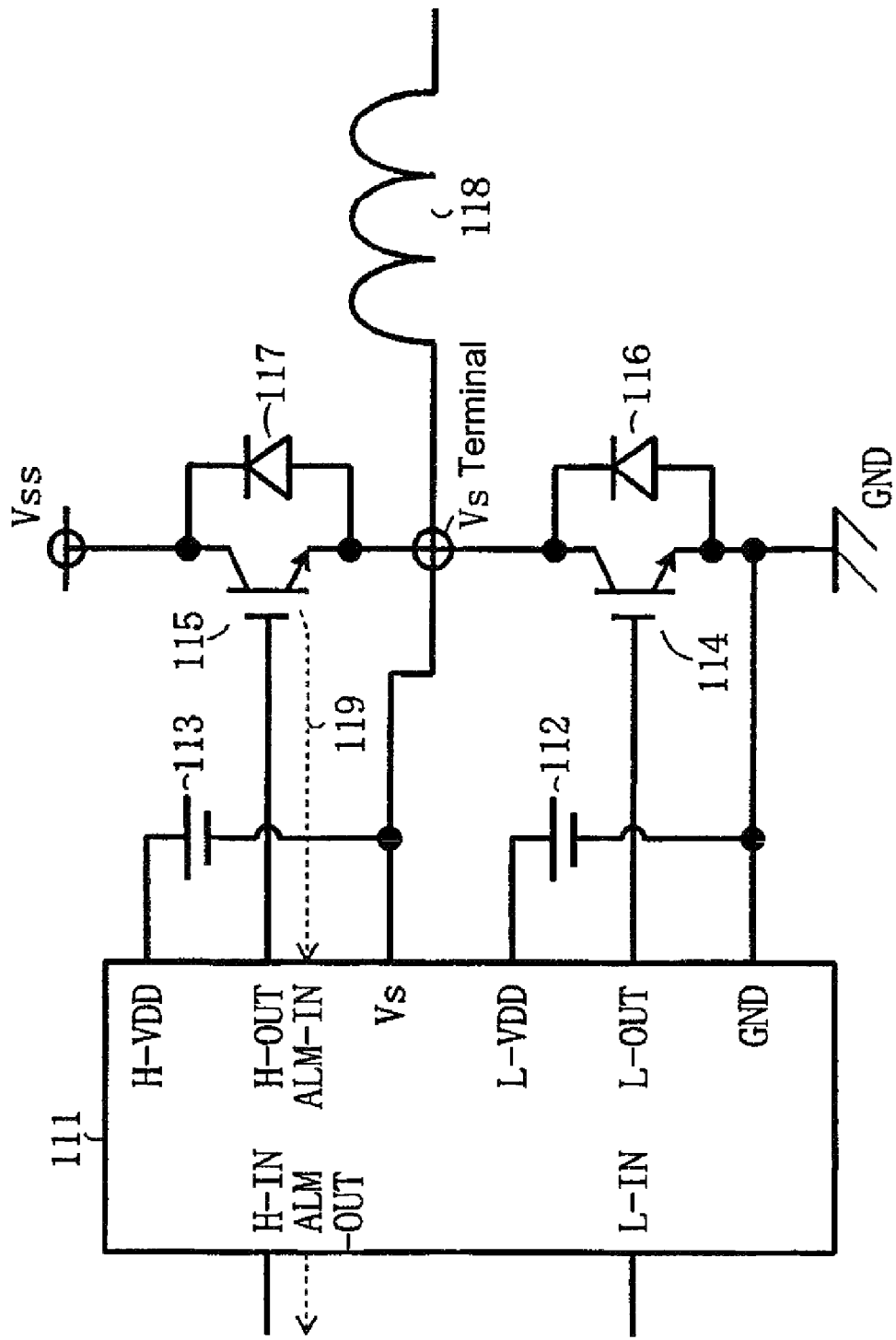
FIG. 17 illustrates an example of connection of a power semiconductor switching element of an inverter or other power conversion device, and a semiconductor device that drives the element.
Figure 18:
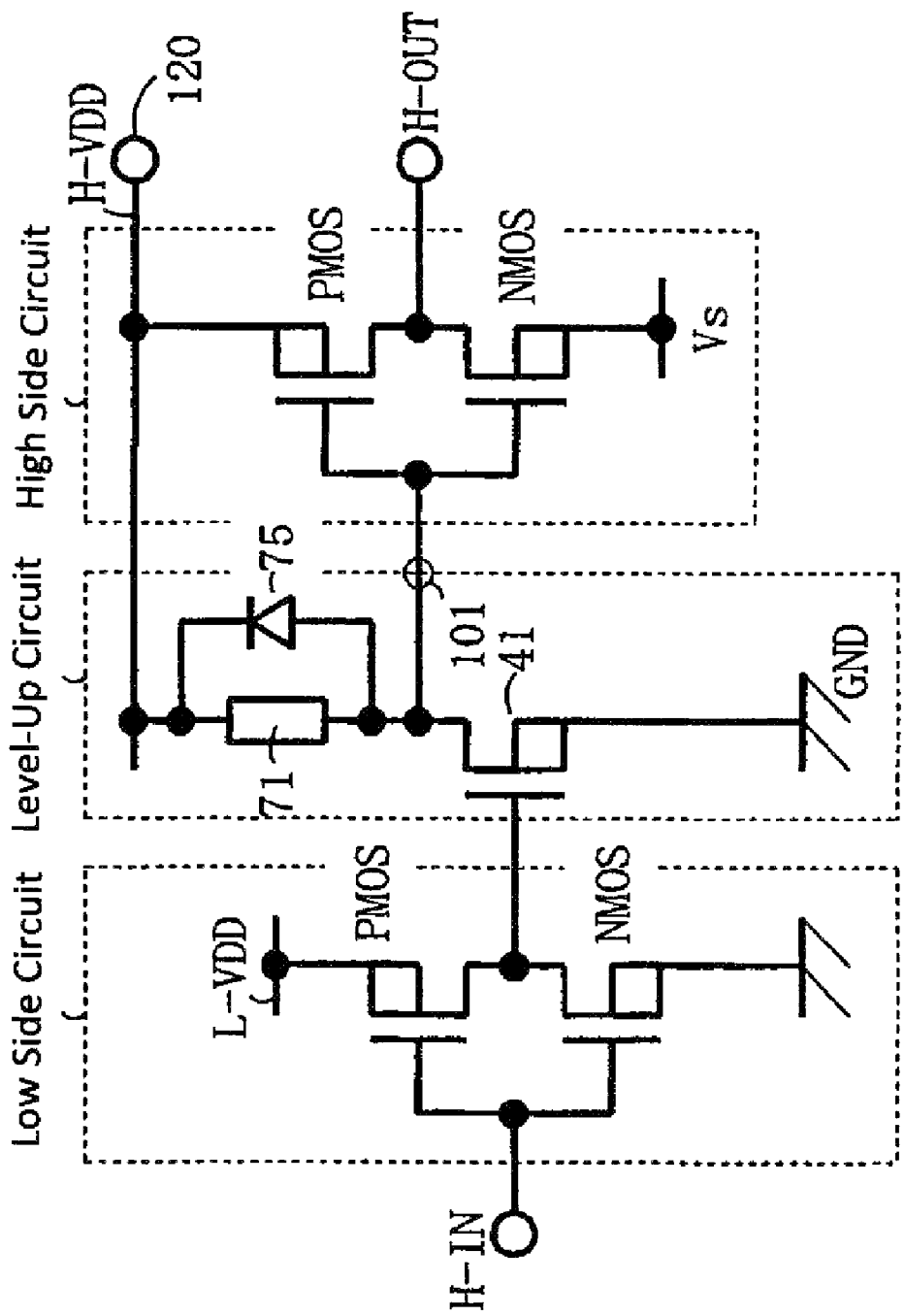
FIG. 18 illustrates a circuit diagram of a conventional level shift circuit and peripheral circuits thereof (low-side C-MOS circuit and high-side C-MOS circuit), with a circuit diagram containing a level-up circuit.
Figure 19:
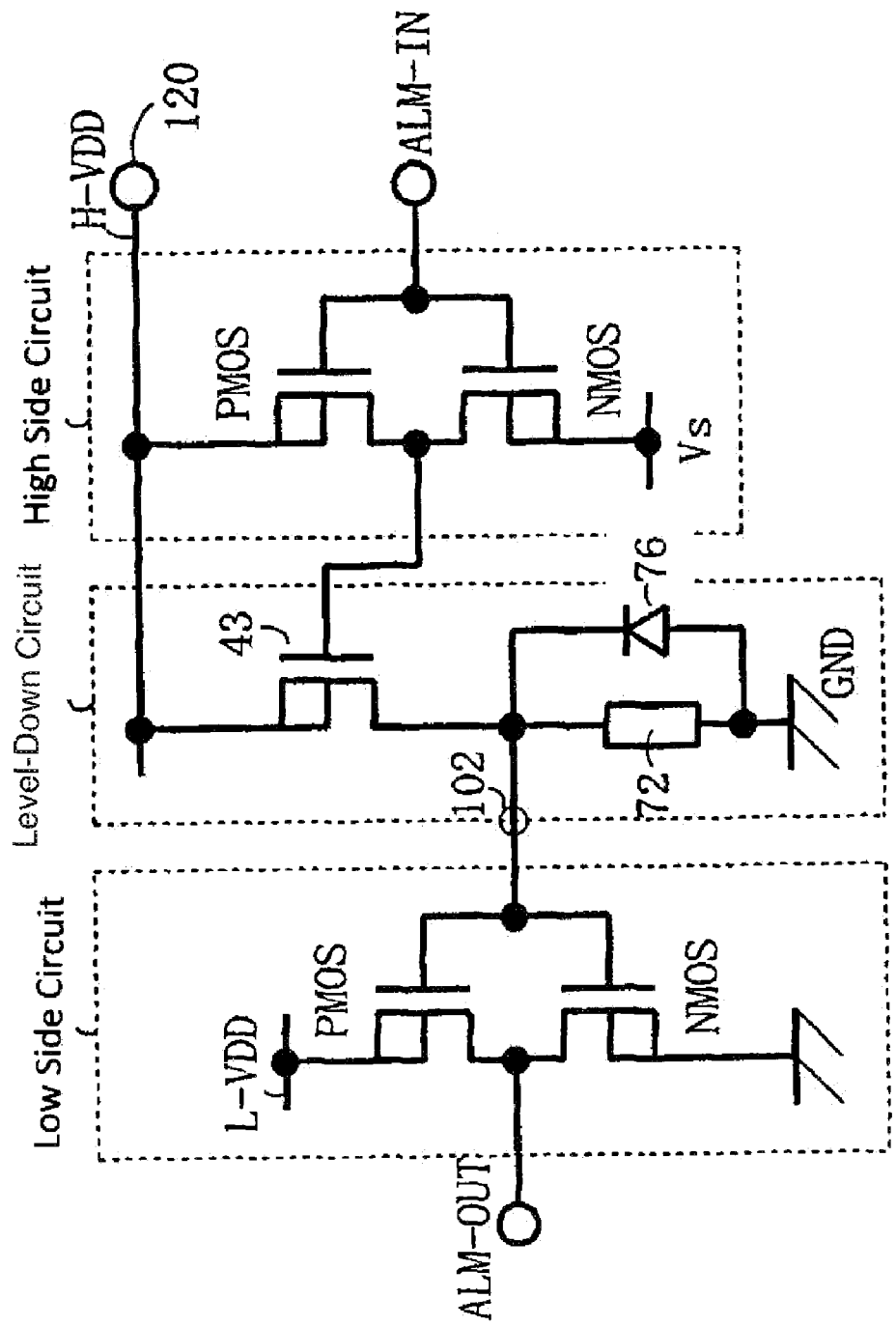
FIG. 19 illustrates a circuit diagram of a level shift circuit and peripheral circuits thereof (low-side C-MOS circuit and high-side C-MOS circuit), with a circuit diagram containing a level-down circuit.
Figure 21:
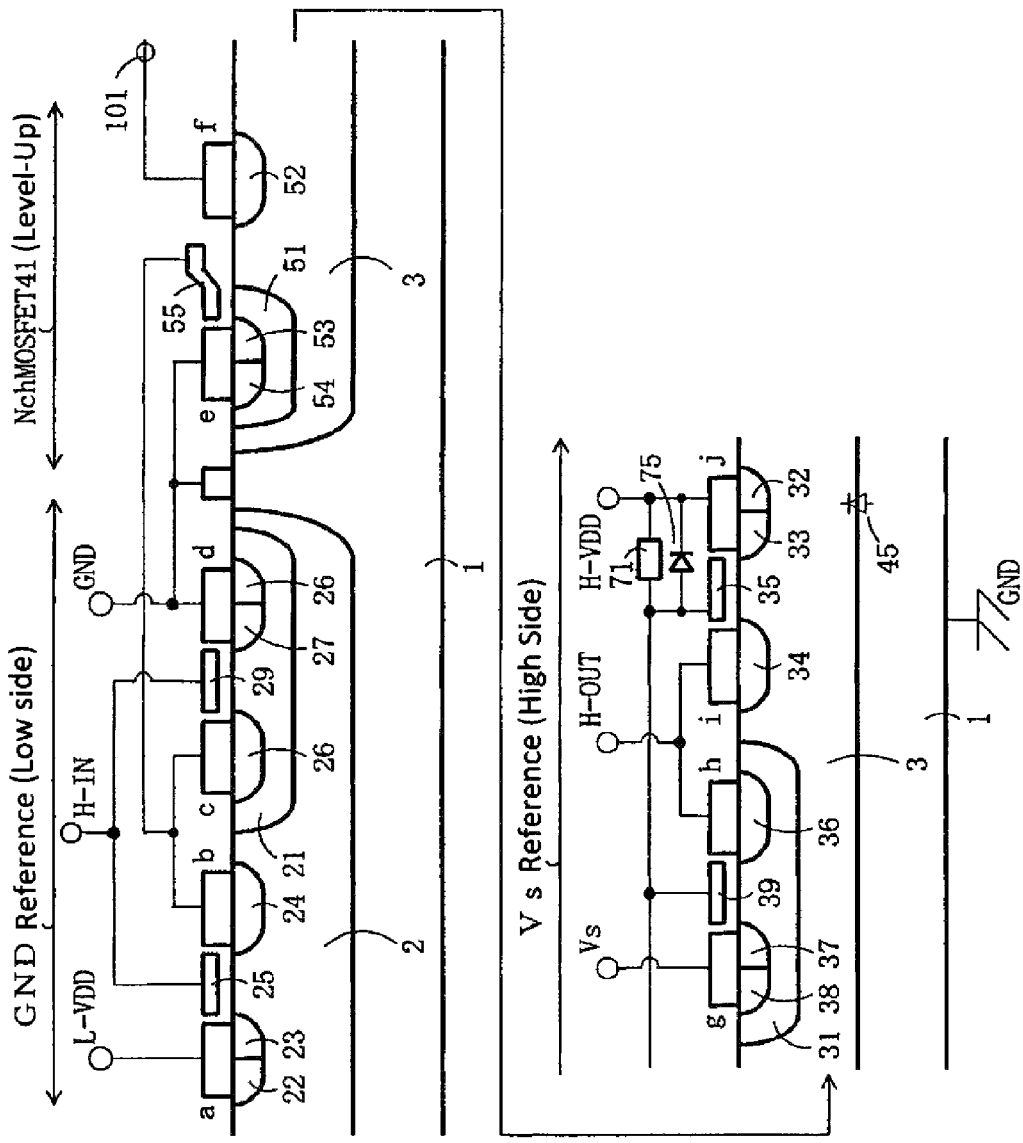
FIG. 21 illustrates a cross-sectional view of a junction-isolation type semiconductor device embodying the level-up circuit FIG. 20A.
Figure 22:
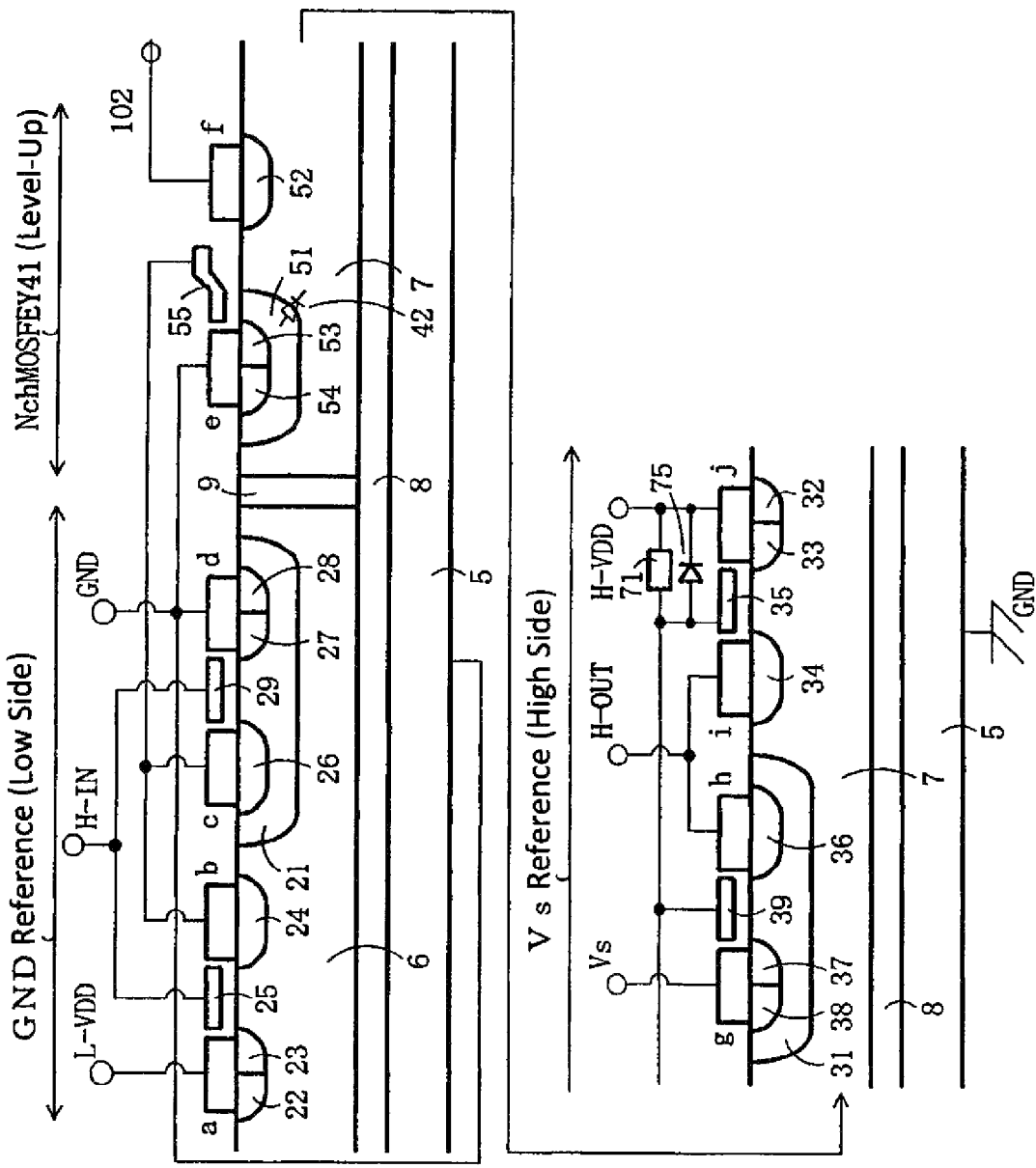
FIG. 22 illustrates a cross-sectional view of an insulation-isolation type semiconductor device embodying the level-up circuit of FIG. 20A.

Referring to FIGS. 15 and 16, the semiconductor devices are different from FIGS. 11 and 12 in that they are junction-isolation elements, the level shift circuits of the junction-isolation elements and the low-side CMOS circuits and high-side CMOS circuits are formed in the n-well regions 3, 2, and these circuits are connected to the high-voltage power supply terminal 120 via current-limiting resistors 73, 74. The high-voltage power supply terminal is a pad electrode element formed on the outer periphery of the semiconductor chip (the semiconductor chip on which the semiconductor device 111 of FIG. 17 is formed).

The MOSFETs 41, 43 are formed in the n region 3, but can be formed in an n region separate from the n region 3. In the above embodiments, Vss is approximately 1200 V, and H-VDD is a potential approximately 20 V higher than Vs. The substrate is connected to ground.

By connecting a current-limiting resistor in the path between the high-potential side (H-VDD) and low-potential side (ground) of the low-voltage power supply with Vs as a reference of the level shift circuit, even when the H-VDD goes to a negative potential due to the L load, the current-limiting resistor limits the forward-direction current flowing in the body diode and parasitic diode, preventing the level shift circuit from failing or malfunctioning so that it can operate with stability.

By connecting in parallel with the two ends of the current-limiting resistor, a circuit in which the ESD protection diode and the Zener diode are reversely connected in series, even when an ESD surge is applied to the H-VDD terminal, the current-limiting resistor can be protected. Further, when this current-limiting resistor is formed on the substrate with an insulating film intervening, and when diffusion resistance is formed, insulation breakdown of the insulating film and junction breakdown of the pn junction can be prevented.

Further, when a junction-isolated element, by directly connecting the current-limiting resistor to the H-VDD terminal, connecting the high-potential side of the level shift circuit and peripheral circuit thereof to the current-limiting resistor, and connecting in parallel with the two ends of the current-limiting resistor a circuit in which are reverse-series-connected an ESD protection diode and a Zener diode, even when an ESD surge is applied to H-VDD, the current-limiting resistor can be protected.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-144521 filed on 31 May 2007. The disclosure of the priority application in its entirety, including the drawings, claims, and the specification thereof, is incorporated herein by reference.

What is claimed is:

1. A level shift circuit of a driving circuit for driving a gate of a power device, which has one main terminal connected to a high-potential side of a high-voltage power supply and another main terminal connected to a load, wherein a signal of a low-potential side low-voltage circuit region to which current is supplied from a low-voltage power supply, with a low-potential side of the high-voltage power supply as a reference, is converted into a signal of a high-potential side low-voltage circuit region to which current is supplied from the low-voltage power supply with the other main terminal of the power device as a reference, the level shift circuit comprising:

a first circuit provided between the high-potential side of the low-voltage power supply, with the another main terminal of the power device as a reference, and the low-potential side of the high-voltage power supply,
wherein the first circuit comprises:
a current-limiting resistor;
a MOSFET, with a source region and a channel region connected via a terminal, connected in series with the current-limiting resistor;
a level shift resistor connected in series with the current-limiting resistor; and
a protection diode connected in parallel with the level shift resistor, with the high-potential side of the low-voltage power supply as a cathode, wherein the current-limiting resistor limits current flowing in a body diode connected in parallel with, and integral with the MOSFET and is connected in series with a drain region of the MOSFET, with the current-limiting resistor between the MOSFET and the level shift resistor; and wherein the current-limiting resistor has a resistance value in the range of $1/10$ to $1/100$ of a resistance value of the level shift resistor.

2. The level shift circuit according to claim 1, further including an ESD protection diode and a Zener diode reversely connected in series, wherein the serially connected ESD protection diode and the Zener diode are connected in parallel with the current-limiting resistor, with an anode side of the ESD protection diode at the low-potential side of the high-voltage power supply.

3. A semiconductor device comprising:

a level shift circuit, a low-potential side low-voltage circuit region, and a high-potential side low-voltage circuit region on a same substrate, wherein the level shift circuit is for driving a gate of a power device, which has one main terminal connected to a high-potential side of a high-voltage power supply and another main terminal connected to a load, wherein a signal of the low-potential side low-voltage circuit region to which current is supplied from a low-voltage power supply, with a low-potential side of the high-voltage power supply as a reference, is converted into a signal of the high-potential side low-voltage circuit region to which current is supplied from the low-voltage power supply with the other main terminal of the power device as a reference, wherein the level shift circuit comprises:

a first circuit provided between the high-potential side of the low-voltage power supply with the another main terminal of the power device as a reference and the low-potential side of the high-voltage power supply, wherein the first circuit comprises:

a first circuit provided between the high-potential side of the low-voltage power supply, with the another main terminal of the power device as a reference, and the low-potential side of the high-voltage power supply, wherein the first circuit comprises:

a current-limiting resistor;

a MOSFET, with a source region and a channel region connected via a terminal, connected in series with the current-limiting resistor;

a level shift resistor connected in series with the current-limiting resistor; and a protection diode connected in parallel with the level shift resistor, with the high-potential side of the low-voltage power supply as a cathode, wherein the current-limiting resistor limits current flowing in a body diode connected in parallel with, and integral with the MOSFET and is connected in series with a drain region of the MOSFET, with the current-limiting resistor between the MOSFET and the level shift resistor, wherein the current-limiting resistor has a resistance value in the range of $1/10$ to $1/100$ of a resistance value of the level shift resistor, and wherein the MOSFET comprises:

the substrate of a p-type semiconductor substrate;

an n-type semiconductor region in the p-type semiconductor substrate and connected to one end of the current-limiting resistor;

a p-type base region selectively placed in the n-type semiconductor region;

the source region of an n-type source region selectively placed in the base region;

a p-type contact region selectively placed adjacent to the source region in the base region; and the drain region of an n-type drain region selectively placed in the n-type semiconductor region, spaced from the base region, wherein the source region and the contact region are connected to the low-potential side of the high-voltage power supply, and wherein the drain region is connected to one end of the level shift resistor, the other end of the level shift resistor is connected to one end of the current-limiting resistor, and the other end of the current-limiting resistor is connected to the high-potential side of the low-voltage power supply.

4. The semiconductor device according to claim 3, further including an ESD protection diode and a Zener diode reversely connected in series, wherein the serially connected ESD protection diode and the Zener diode are connected in parallel with the current-limiting resistor, with an anode side of the ESD protection diode at the low-potential side of the high-voltage power supply.

5. The semiconductor device according to claim 3, wherein the high-potential side low-voltage circuit region is in the n-type semiconductor region.

6. The semiconductor device according claim 3, wherein the n-type semiconductor region is an insulation-isolated region, surrounded by an insulating region.

7. A semiconductor device comprising:

a level shift circuit, a low-potential side low-voltage circuit region, and a high-potential side low-voltage circuit region on a same substrate, wherein the level shift circuit is for driving a gate of a power device, which has one main terminal connected to a high-potential side of a high-voltage power supply and another main terminal connected to a load, wherein a signal of the low-potential side low-voltage circuit region to which current is supplied from a low-voltage power supply, with a low-potential side of the high-voltage power supply as a reference, is converted into a signal of the high-potential side low-voltage circuit region to which current is supplied from the low-voltage power supply with the other main terminal of the power device as a reference, wherein the level shift circuit comprises:

a first circuit provided between the high-potential side of the low-voltage power supply with the another main terminal of the power device as a reference and the low-potential side of the high-voltage power supply, wherein the first circuit comprises:

a first circuit provided between the high-potential side of the low-voltage power supply, with the another main terminal of the power device as a reference, and the low-potential side of the high-voltage power supply, wherein the first circuit comprises:

a current-limiting resistor;

a MOSFET, with a source region and a channel region connected via a terminal, connected in series with the current-limiting resistor;

a level shift resistor connected in series with the current-limiting resistor; and a protection diode connected in parallel with the level shift resistor, with the high-potential side of the low-voltage power supply as a cathode, wherein the current-limiting resistor limits current flowing in a body diode connected in parallel with, and integral with the MOSFET and is connected in series with a drain region of the MOSFET, with the current-limiting resistor between the MOSFET and the level shift resistor, and wherein the current-limiting resistor has a resistance value in the range of $\frac{1}{10}$ to $\frac{1}{100}$ of a resistance value of the level shift resistor, and wherein the MOSFET comprises:

the substrate of a p-type semiconductor substrate;

an n-type semiconductor region placed in the p-type semiconductor substrate and connected to one end of the current-limiting resistor;

the source region of a p-type source region selectively placed in the n-type semiconductor region;

an n-type contact region placed adjacent to the source region; and the drain region of a p-type drain region placed selectively in the n-type semiconductor region, spaced from the source region, wherein the source region and the contact region are connected to one end of the current-limiting resistor, and wherein the drain region is connected to one end of the level shift resistor, the other end of the level shift resistor is connected to the low-potential side of the high-voltage power supply, and the other end of the current-limiting resistor is connected to the high-potential side of the low-voltage power supply.

8. The semiconductor device according to claim 7, further including an ESD protection diode and a Zener diode reversely connected in series, wherein the serially connected ESD protection diode and the Zener diode are connected in parallel with the current-limiting resistor, with an anode side of the ESD protection diode at the low-potential side of the high-voltage power supply.

9. The semiconductor device according to claim 7, wherein the high-potential side low-voltage circuit region is in the n-type semiconductor region.

10. The semiconductor device according claim 7, wherein the n-type semiconductor region is an insulation-isolated region, surrounded by an insulating region.

11. A semiconductor device comprising:

a level shift circuit, a low-potential side low-voltage circuit region, and a high-potential side low-voltage circuit region on a same substrate, wherein the level shift circuit is for driving a gate of a power device, which has one main terminal connected to a high-potential side of a high-voltage power supply and another main terminal connected to a load, wherein a signal of the low-potential side low-voltage circuit region to which current is supplied from a low-voltage power supply, with a low-potential side of the high-voltage power supply as a reference, is converted into a signal of the high-potential side low-voltage circuit region to which current is supplied from the low-voltage power supply with the other main terminal of the power device as a reference, wherein the level shift circuit comprises:

a first circuit provided between the high-potential side of the low-voltage power supply with the another main terminal of the power device as a reference and the low-potential side of the high-voltage power supply, wherein the first circuit comprises:

a first circuit provided between the high-potential side of the low-voltage power supply, with the another main terminal of the power device as a reference, and the low-potential side of the high-voltage power supply, wherein the first circuit comprises:

a current-limiting resistor;

a MOSFET, with a source region and a channel region connected via a terminal, connected in series with the current-limiting resistor;

a level shift resistor connected in series with the current-limiting resistor; and a protection diode connected in parallel with the level shift resistor, with the high-potential side of the low-voltage power supply as a cathode, wherein the current-limiting resistor limits current flowing in a body diode connected in parallel with, and integral with the MOSFET and is connected in series with a drain region of the MOSFET, with the current-limiting resistor between the MOSFET and the level shift resistor, and wherein the current-limiting resistor has a resistance value in the range of $\frac{1}{10}$ to $\frac{1}{100}$ of a resistance value of the level shift resistor, and wherein the high-potential side low-voltage circuit region is in an n-type semiconductor insulation-isolated region in the substrate, which is a p-type semiconductor substrate, and connected to the high-potential side of the low voltage power supply with the another main terminal of the power device as a reference.

12. The semiconductor device according to claim 11, wherein the MOSFET comprises:

an n-type semiconductor region in the p-type semiconductor substrate and connected to the high potential of the low-voltage power supply with the another main terminal of the power device as a reference;

a p-type base region selectively placed in the n-type semiconductor region;

the source region of an n-type source region selectively placed in the base region;

a p-type contact region selectively placed adjacent to the source region in the base region; and the drain region of an n-type drain region selectively placed in the n-type semiconductor region, spaced from the base region;

wherein the source region and the contact region are connected to the low-potential side of the high-voltage power supply, and wherein the drain region is connected to one end of the current-limiting resistor, the other end of the current-limiting resistor is connected to one end of the level shift resistor, and the other end of the level shift resistor is connected to the high-potential side of the low-voltage power supply with the another main terminal of the power device as a reference.

13. The semiconductor device according to claim 12, wherein the n-type semiconductor region is an insulation-isolated region, surrounded by an insulating region.

14. The semiconductor device according to 11, wherein the MOSFET comprises:

a second n-type semiconductor insulation-isolated region in the p-type semiconductor substrate and connected to the high potential of the low-voltage power supply with the another main terminal of the power device as a reference;

the source region of a p-type source region selectively placed in the second n-type semiconductor region;

an n-type contact region selectively placed adjacent to the source region; and the source region of a p-type drain region selectively placed in the second n-type semiconductor insulation-isolated region, spaced from the source region, wherein the source region and the contact region are connected to the high-potential side of the low-voltage power supply with the another main terminal of the power device as a reference, and wherein the drain region is connected to one end of the current-limiting resistor, the other end of the current-limiting resistor is connected to one end of the level shift resistor, and the other end of the level shift resistor is connected to the low-potential side of the high-voltage power supply.

15. The semiconductor device according to claim 14, wherein the first n-type semiconductor insulation-isolated region and the second n-type semiconductor insulation-isolated region are the same region.

* * * * *